(12) United States Patent
Miyamoto et al.

(10) Patent No.: US 10,558,097 B2
(45) Date of Patent: Feb. 11, 2020

(54) ACTIVE MATRIX SUBSTRATE AND DEMULTIPLEXER CIRCUIT

(71) Applicant: Sharp Kabushiki Kaisha, Sakai, Osaka (JP)

(72) Inventors: Tadayoshi Miyamoto, Sakai (JP); Yoshinobu Nakamura, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/124,273

(22) Filed: Sep. 7, 2018

(65) Prior Publication Data

US 2019/0079331 A1    Mar. 14, 2019

(30) Foreign Application Priority Data

Sep. 12, 2017 (JP) .................................. 2017-174544

(51) Int. Cl.
*G02F 1/1345* (2006.01)
*H01L 29/786* (2006.01)
(Continued)

(52) U.S. Cl.
CPC ........ *G02F 1/13454* (2013.01); *G02F 1/1368* (2013.01); *G02F 1/133345* (2013.01);
(Continued)

(58) Field of Classification Search
CPC .......... G02F 1/13454; G02F 1/133345; G02F 1/134363; G02F 1/136209;
(Continued)

(56) References Cited

U.S. PATENT DOCUMENTS

| 7,903,072 B2 * | 3/2011 | Yamazaki ............ G09G 3/3688 345/98 |
| 10,020,374 B2 * | 7/2018 | Sone .................. H01L 27/1248 |

(Continued)

FOREIGN PATENT DOCUMENTS

| JP | 2006-119404 A | 5/2006 |
| JP | 2008-032899 A | 2/2008 |

(Continued)

*Primary Examiner* — Peter D McLoone
(74) *Attorney, Agent, or Firm* — Keating & Bennett, LLP

(57) ABSTRACT

In a demultiplexer circuit, each unit circuit includes at least n TFTs 30 and n branch lines connected with one video signal line. Each TFT 30 includes an oxide semiconductor layer 7, an upper gate electrode 11 provided on the oxide semiconductor layer with a gate insulating layer 9 interposed therebetween, and a first electrode 13 and a second electrode 15. The demultiplexer circuit further includes a first interlayer insulating layer 21 covering the oxide semiconductor layer and the upper gate electrode and a second interlayer insulating layer 23 provided on the first interlayer insulating layer. The first electrode 13 is provided between the first interlayer insulating layer 21 and the second interlayer insulating layer 23 and is in contact with the oxide semiconductor layer inside a first contact hole CH1 formed in the first interlayer insulating layer. The second electrode 15 is provided on the second interlayer insulating layer 23 and is in contact with the oxide semiconductor layer inside a second contact hole CH2 formed in the first and second interlayer insulating layers.

17 Claims, 11 Drawing Sheets

(51) Int. Cl.
- *H01L 27/12* (2006.01)
- *H01L 29/417* (2006.01)
- *G02F 1/1333* (2006.01)
- *G02F 1/1343* (2006.01)
- *G02F 1/1362* (2006.01)
- *G02F 1/1368* (2006.01)
- *G09G 3/36* (2006.01)
- *G02F 1/136* (2006.01)

(52) U.S. Cl.
CPC .. *G02F 1/134363* (2013.01); *G02F 1/136209* (2013.01); *G02F 1/136227* (2013.01); *G02F 1/136286* (2013.01); *G09G 3/3648* (2013.01); *H01L 27/124* (2013.01); *H01L 27/1225* (2013.01); *H01L 27/1248* (2013.01); *H01L 29/41733* (2013.01); *H01L 29/7869* (2013.01); *G02F 2001/13606* (2013.01); *G02F 2001/13685* (2013.01); *G02F 2001/134372* (2013.01); *G09G 2300/0408* (2013.01); *G09G 2300/0426* (2013.01); *G09G 2300/0809* (2013.01); *G09G 2310/0297* (2013.01)

(58) Field of Classification Search
CPC ......... G02F 1/136227; G02F 1/136286; G02F 1/1368; G02F 2001/134372; G02F 2001/13606; G02F 2001/13685; G09G 3/3648; G09G 2300/0408; G09G 2300/0426; G09G 2300/0809; G09G 2310/0297; H01L 27/1225; H01L 27/124; H01L 29/7869

See application file for complete search history.

(56) References Cited

U.S. PATENT DOCUMENTS

| | | |
|---|---|---|
| 2008/0024416 A1 | 1/2008 | Onogi et al. |
| 2008/0224982 A1 | 9/2008 | Yamazaki |
| 2008/0225024 A1 | 9/2008 | Ito |
| 2009/0323005 A1 | 12/2009 | Ota |
| 2012/0138922 A1 | 6/2012 | Yamazaki et al. |
| 2012/0248451 A1 | 10/2012 | Sone et al. |
| 2013/0038518 A1 | 2/2013 | Tagawa et al. |
| 2013/0320334 A1 | 12/2013 | Yamazaki et al. |
| 2014/0286076 A1 | 9/2014 | Aoki et al. |
| 2015/0108467 A1 | 4/2015 | Moriguchi et al. |

FOREIGN PATENT DOCUMENTS

| | | |
|---|---|---|
| JP | 2008-225036 A | 9/2008 |
| JP | 2010-008758 A | 1/2010 |
| JP | 2012-134475 A | 7/2012 |
| JP | 2014-007399 A | 1/2014 |
| JP | 2014-209727 A | 11/2014 |
| WO | 2011/118079 A1 | 9/2011 |
| WO | 2012/086513 A1 | 6/2012 |

\* cited by examiner

ACTIVE MATRIX SUBSTRATE AND DEMULTIPLEXER CIRCUIT

BACKGROUND

1. Technical Field

The present invention relates to an active matrix substrate which includes a demultiplexer circuit and to a demultiplexer circuit.

2. Description of the Related Art

An active matrix substrate for use in a liquid crystal display device, or the like, has a display region which includes a plurality of pixels and a region exclusive of the display region (non-display region or frame region). In the display region, a plurality of pixels are two-dimensionally arranged in the row and column directions. Each pixel includes a switching element, such as a thin film transistor (TFT). As such a switching element, a TFT which includes an amorphous silicon film as the active layer (hereinafter, "amorphous silicon TFT") and a TFT which includes a polycrystalline silicon film as the active layer (hereinafter, "polycrystalline silicon TFT") have been widely used in conventional devices.

Using an oxide semiconductor as a material of the active layer of TFTs, instead of amorphous silicon and polycrystalline silicon, has been proposed. Such TFTs are referred to as "oxide semiconductor TFTs". The oxide semiconductor has higher mobility than the amorphous silicon. Therefore, oxide semiconductor TFTs are capable of higher speed operation than amorphous silicon TFTs.

In some cases, peripheral circuits such as driving circuits are monolithically (integrally) formed in the non-display region of the active matrix substrate. By monolithically forming the driving circuits, narrowing of the non-display region and a cost reduction which is attributed to simplification of the mounting process are realized. For example, in some cases, in the non-display region, a gate driver circuit is monolithically formed, and a source driver circuit is mounted by a COG (Chip on Glass) technique.

For devices of which narrowing of the frame has been highly demanded, such as smartphones, monolithically forming a demultiplexer circuit such as source shared driving (SSD) circuit in addition to the gate driver has been proposed (e.g., WO 2011/118079). The SSD circuit is a circuit for distributing video data, which is supplied via a single video signal line from each terminal of the source driver, to a plurality of source bus lines. Incorporation of the SSD circuit enables further narrowing of a part of the non-display region in which terminals are provided (terminal formation region). Further, the number of outputs from the source driver is reduced, and accordingly, the circuit size can be reduced. Therefore, the cost of the driver IC can be reduced.

A peripheral circuit, such as driving circuit, SSD circuit, or the like, includes TFTs. In this specification, a TFT which is provided as a switching element in each pixel of the display region is referred to as "pixel TFT", and a TFT which is a constituent of the peripheral circuit is referred to as "circuit TFT". Of the circuit TFTs, a TFT which is used as a switching element in a demultiplexer circuit (or SSD circuit) is referred to as "DMX circuit TFT" (or "SSD circuit TFT"). In an active matrix substrate in which an oxide semiconductor TFT is used as a pixel TFT, it is preferred from the viewpoint of the manufacturing process that an oxide semiconductor TFT in which the same oxide semiconductor film as that of the pixel TFT is used is formed as the circuit TFT.

SUMMARY

A DMX circuit TFT, such as SSD circuit TFT, is designed such that a relatively large current flows, and therefore, the TFT size (channel width) is large. Particularly when an oxide semiconductor TFT is used as the DMX circuit TFT, the channel width is large as compared with a case where a polycrystalline silicon TFT is used because the oxide semiconductor has a higher mobility than the polycrystalline silicon by about one order of magnitude. This can be a factor which increases the area of the demultiplexer circuit (or frame region). Thus, it is required to further reduce the size (e.g., the width in the channel length direction) of the DMX circuit TFT.

An embodiment of the present invention was conceived in view of the above-described circumstances. An object of the present invention is to reduce the size of TFTs which are constituents of a demultiplexer circuit monolithically formed in an active matrix substrate.

An active matrix substrate according to one embodiment of the present invention is an active matrix substrate having a display region including a plurality of pixels and a non-display region provided around the display region, the active matrix substrate including: a substrate; a demultiplexer circuit provided in the non-display region and supported by the substrate; and a plurality of source bus lines extending in a first direction and a plurality of gate bus lines extending in a second direction in the display region, the second direction intersecting with the first direction, wherein the demultiplexer circuit includes a plurality of unit circuits, each of the unit circuits being capable of distributing a video signal from one of a plurality of video signal lines to n source bus lines out of the plurality of source bus lines (n is an integer not less than 2), each of the plurality of unit circuits includes at least n TFTs and n branch lines connected with the one video signal line, each of the at least n TFTs includes an oxide semiconductor layer, an upper gate electrode provided on the oxide semiconductor layer with a gate insulating layer interposed therebetween, and first and second electrodes electrically coupled with the oxide semiconductor layer, one of the first and second electrodes being a drain electrode electrically coupled with one of the n source bus lines, the other of the first and second electrodes being a source electrode electrically coupled with one of the n branch lines, the active matrix substrate further includes a first interlayer insulating layer covering the oxide semiconductor layer and the upper gate electrode and a second interlayer insulating layer provided on the first interlayer insulating layer, the first electrode is provided between the first interlayer insulating layer and the second interlayer insulating layer and is in contact with the oxide semiconductor layer inside a first contact hole formed in the first interlayer insulating layer, and the second electrode is provided on the second interlayer insulating layer and is in contact with the oxide semiconductor layer inside a second contact hole formed in the second interlayer insulating layer and the first interlayer insulating layer.

In one embodiment, in each of the at least n TFTs, the first electrode partially overlaps the upper gate electrode with the first interlayer insulating layer interposed therebetween, and the second electrode partially overlaps the upper gate electrode with the first interlayer insulating layer and the second interlayer insulating layer interposed therebetween.

In one embodiment, a channel length direction of the at least n TFTs is the first direction, and a channel width direction of the at least n TFTs is the second direction.

In one embodiment, each of the at least n TFTs further includes a lower electrode provided on the substrate side of the oxide semiconductor layer.

In one embodiment, the lower electrode is grounded.

In one embodiment, the lower electrode is electrically coupled with the upper gate electrode.

In one embodiment, the lower electrode is set to a potential different from that of the upper gate electrode.

In one embodiment, the demultiplexer circuit includes a first TFT of which the first electrode is a source electrode and the second electrode is a drain electrode and a second TFT of which the first electrode is a drain electrode and the second electrode is a source electrode.

In one embodiment, the demultiplexer circuit includes a plurality of sub-circuits, each of the sub-circuits includes at least first and second unit circuits out of the plurality of unit circuits, and in the each sub-circuit, the n source bus lines of the first unit circuit and the n source bus lines of the second unit circuit are arranged alternately in a one-by-one fashion in the second direction.

In one embodiment, in each of the first unit circuit and the second unit circuit, the at least n TFTs are arranged in the first direction, and in the each sub-circuit, a first unit circuit formation region in which the at least n TFTs of the first unit circuit are provided is present between a second unit circuit formation region in which the at least n TFTs of the second unit circuit are provided and the display region.

In one embodiment, the at least n TFTs of each of the first unit circuit and the second unit circuit include a first TFT of which the first electrode is a source electrode and the second electrode is a drain electrode and a second TFT of which the first electrode is a drain electrode and the second electrode is a source electrode.

In one embodiment, a width in a channel length direction of each of the at least n TFTs is smaller than an arrangement pitch of the plurality of source bus lines.

In one embodiment, the above-described active matrix substrate further includes a pixel TFT provided in each of the plurality of pixels, wherein the pixel TFT includes another oxide semiconductor layer, another source electrode, another drain electrode, and another upper gate electrode provided on a side of the another oxide semiconductor layer opposite to the substrate with an insulating film interposed therebetween, and the another source electrode is provided in a same electrically-conductive layer as the plurality of source bus lines, and the another drain electrode is provided in another electrically-conductive layer lying above the electrically-conductive layer.

In one embodiment, the oxide semiconductor layer includes an In—Ga—Zn—O based semiconductor.

In one embodiment, the In—Ga—Zn—O based semiconductor includes a crystalline portion.

A demultiplexer circuit according to one embodiment of the present invention includes a plurality of unit circuits, each of the unit circuits being capable of distributing a video signal from one of a plurality of video signal lines to n source bus lines out of a plurality of source bus lines (n is an integer not less than 2), wherein each of the plurality of unit circuits includes at least n TFTs and n branch lines connected with the one video signal line, each of the at least n TFTs includes an oxide semiconductor layer, an upper gate electrode provided on the oxide semiconductor layer with a gate insulating layer interposed therebetween, and first and second electrodes electrically coupled with the oxide semi- conductor layer, one of the first and second electrodes being a drain electrode electrically coupled with one of the n source bus lines, the other of the first and second electrodes being a source electrode electrically coupled with one of the n branch lines, the demultiplexer circuit further includes a first interlayer insulating layer covering the oxide semiconductor layer and the upper gate electrode and a second interlayer insulating layer provided on the first interlayer insulating layer, the first electrode is provided between the first interlayer insulating layer and the second interlayer insulating layer and is in contact with the oxide semiconductor layer inside a first contact hole formed in the first interlayer insulating layer, and the second electrode is provided on the second interlayer insulating layer and is in contact with the oxide semiconductor layer inside a second contact hole formed in the second interlayer insulating layer and the first interlayer insulating layer.

According to one embodiment of the present invention, in an active matrix substrate in which a demultiplexer circuit is monolithically formed, the size of TFTs which are constituents of the demultiplexer circuit can be reduced.

DETAILED DESCRIPTION

First Embodiment

Hereinafter, an active matrix substrate of the first embodiment is described with reference to the drawings. In the following paragraphs, an example of the active matrix substrate is described in which a demultiplexer circuit (SSD circuit) and a gate driver are monolithically formed and to which a source driver is mounted. Note that the active matrix substrate of the present embodiment only requires that at least the SSD circuit is monolithically formed.

<Configuration of Active Matrix Substrate>

Figure 1:
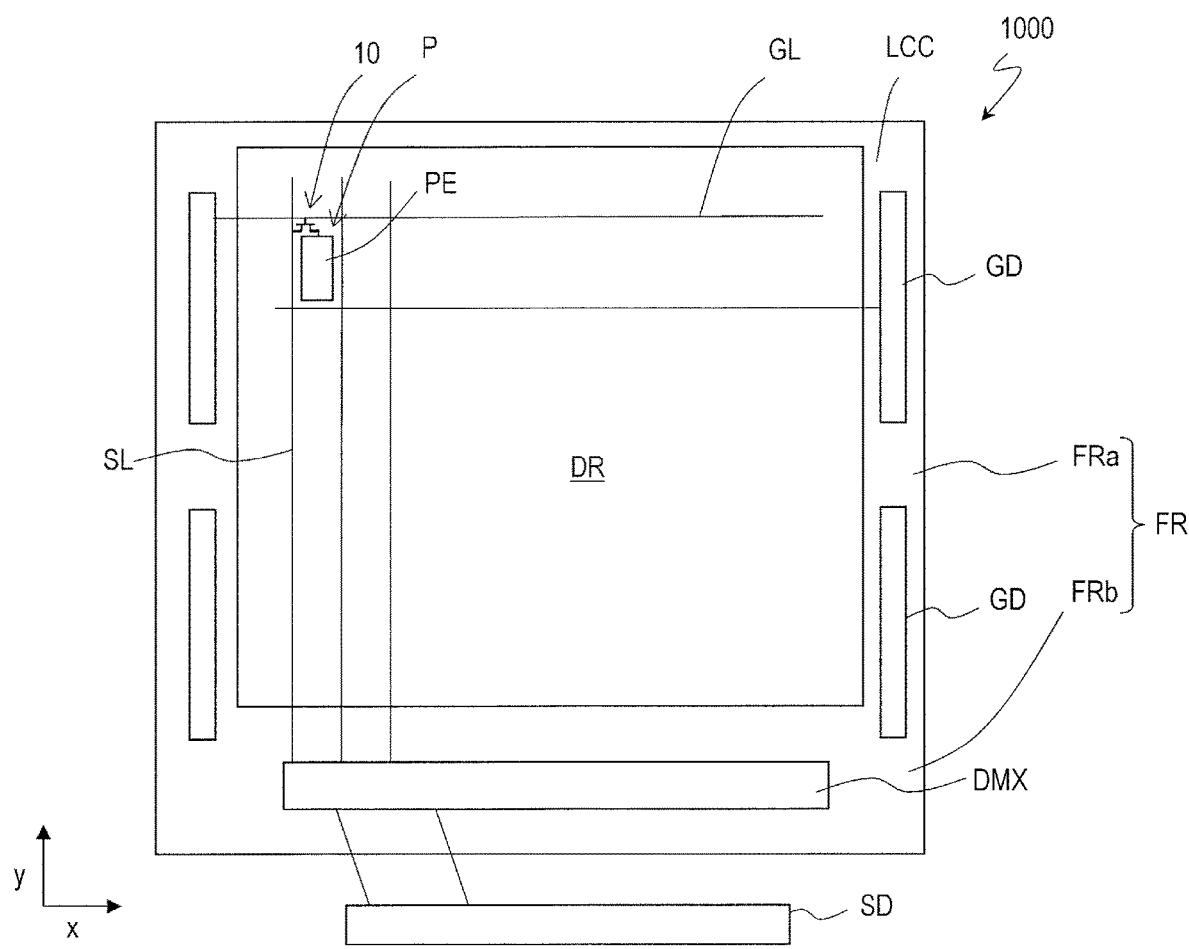
FIG. 1 is a schematic diagram showing an example of a planar configuration of an active matrix substrate 1000 of the first embodiment.

FIG. 1 is a schematic diagram showing an example of a planar configuration of an active matrix substrate 1000 of the present embodiment.

The active matrix substrate 1000 includes a display region DR and a region (non-display region or frame region) FR which is exclusive of the display region DR. The display region DR includes pixel regions P arranged in a matrix. The pixel regions P (also simply referred to as "pixels") are regions corresponding to the pixels of a display device. The non-display region FR is a region which extends around the display region DR and which does not contribute to displaying.

The non-display region FR includes a terminal formation region in which terminal portions are formed and a driving circuit formation region in which a driving circuit is integrally (monolithically) formed. In the driving circuit formation region, for example, a gate driver GD, a demultiplexer circuit DMX, and other elements are monolithically provided. A source driver SD is mounted to, for example, the active matrix substrate 1000. In the example shown in the drawing, the gate driver GD is provided in regions FRa on opposing sides such that the display region DR is interposed between the regions FRa, and the source driver SD is mounted in a region FRb on the lower side of the display region DR. The demultiplexer circuit DMX is provided in the region FRb between the non-display region FR and the source driver SD. The demultiplexer circuit DMX functions as a SSD circuit.

In the display region DR, a plurality of gate bus lines GL extending in the row direction (x direction) and a plurality of source bus lines SL extending in the column direction (y direction) are provided. Each of the pixel regions P is defined by, for example, the gate bus lines GL and the source bus lines SL. The gate bus lines GL are respectively connected with corresponding terminals of the gate driver GD. The source bus lines SL are respectively connected with corresponding terminals of the source driver SD.

Each of the pixel regions P includes a TFT (hereinafter, pixel TFT) 10 and a pixel electrode PE. The gate electrode of the pixel TFT 10 is electrically coupled with a corresponding gate bus line GL. The source electrode of the pixel TFT 10 is electrically coupled with a corresponding source bus line SL. The drain electrode of the pixel TFT 10 is electrically coupled with the pixel electrode PE. When the active matrix substrate 1000 is applied to a display device of transverse electric field mode such as FFS (Fringe Field Switching) mode, an electrode common to a plurality of pixels (common electrode) is provided in the active matrix substrate 1000, although not shown.

<Configuration of Demultiplexer Circuit DMX>

Figure 2:
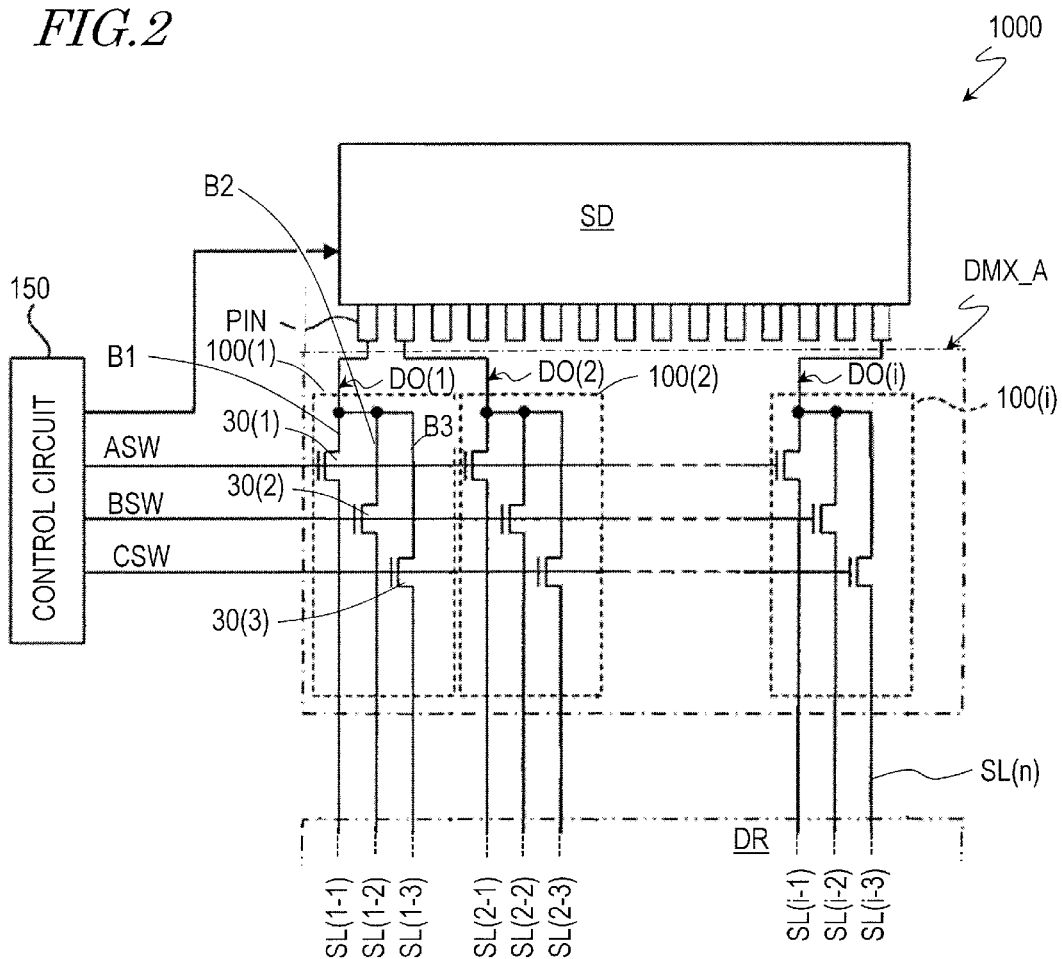
FIG. 2 is a diagram showing a demultiplexer circuit DMX_A in the active matrix substrate 1000 of the first embodiment.

FIG. 2 is a diagram for illustrating the configuration and operation of a demultiplexer circuit DMX_A in the active matrix substrate 1000 of the present embodiment.

The demultiplexer circuit DMX_A is provided between the source driver SD and the display region DR.

The demultiplexer circuit DMX_A includes a plurality of unit circuits 100(1) to 100(i) is an integer not less than 2) (hereinafter, also generically referred to as "unit circuits 100") and n (herein, three) control signal main lines ASW to CSW. The control signal main lines ASW to CSW are connected with a control circuit 150.

Each of the output pins PIN of the source driver SD is connected with any of a plurality of video signal lines DO(1) to DO(i) (also generically referred to as "video signal lines DO"). A group of n source bus lines SL (n is an integer not less than 2; herein, n=3) is associated with a single video signal line DO. Between the video signal lines DO and groups of source bus lines SL, a unit circuit 100 is provided for each group of video signal lines. The unit circuit 100 distributes video data from a single video signal line DO to n source bus lines SL.

Herein, of the plurality of video signal lines DO(1) to DO(i), the Nth video signal line is labelled with DO(N) (N is an integer from 1 to i). A unit circuit 100 and source bus lines SL associated with the video signal line DO(N) are labelled with 100(N) and SL(N-1) to SL(N-n), respectively. The source bus lines SL(N-1) to SL(N-n) may be associated with, for example, R, G, B pixels (i.e., n=3).

The unit circuit 100(N) includes n branch lines B1 to Bn connected with the video signal line DO(N) and n DMX circuit TFTs 30(1) to 30(n) (hereinafter, also generically referred to as "TFTs 30").

The TFT 30 functions as a selection switch. The gate electrode of the TFT 30 is electrically coupled with a corresponding one of n control signal main lines ASW, BSW, CSW. The source electrode of the TFT 30 is electrically coupled with a corresponding one of the branch lines B1 to Bn. The drain electrode of the TFT 30 electrically coupled with a corresponding one of the source bus lines SL(N-1) to SL(N-3).

The gate electrode of the TFT 30 is supplied with a selection signal from one of the control signal main lines ASW to CSW. The selection signal defines the ON period of a selection switch in the same group and is in synchronization with time-series based signal output from the source driver SD. The unit circuit 100(N) writes a data potential obtained by time division of the output of the video signal line DO(N) in a plurality of source bus lines SL(N-1) to SL(N-n) in a time-series manner (time division driving). This can reduce the number of output pins PIN of the source driver SD, and therefore, the area of the non-display region FR can be further reduced (narrowing of the frame).

The operation of a display device with the use of the demultiplexer circuit DMX and the timing chart of the time division driving are disclosed in, for example, Japanese Laid-Open Patent Publication No. 2008-225036, Japanese Laid-Open Patent Publication No. 2006-119404, and WO 2011/118079. The entire disclosures of Japanese Laid-Open Patent Publication No. 2008-225036, Japanese Laid-Open Patent Publication No. 2006-119404, and WO 2011/118079 are incorporated by reference in this specification.

<Configuration of DMX Circuit TFT>

Figure 3A:
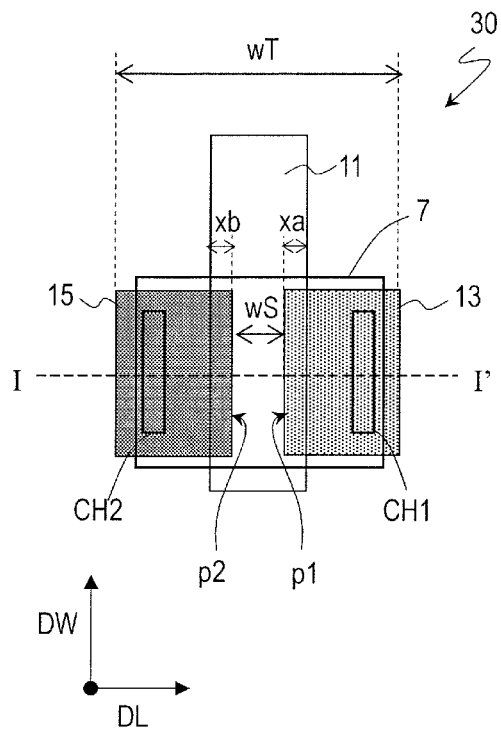
FIGS. 3A and 3B are, respectively, a plan view and a cross-sectional view illustrating a DMX circuit TFT 30 of the first embodiment. A lower-case alphabetical letter in the parentheses after any FIG. number indicates a portion thereof.
Figure 3B:
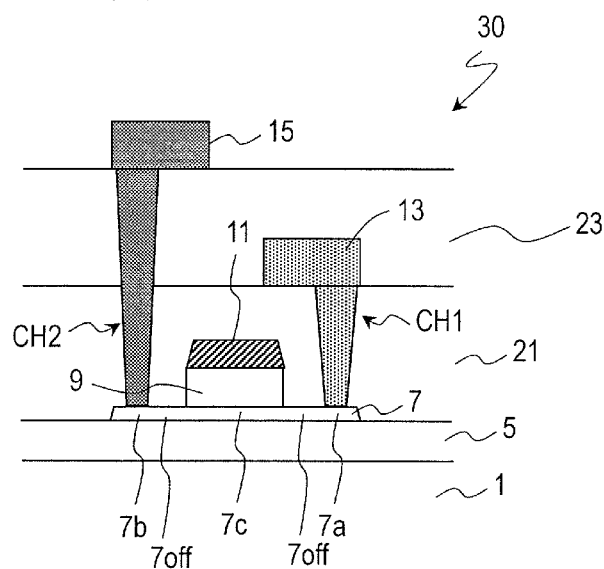

FIGS. 3A and 3B are, respectively, a plan view and a cross-sectional view illustrating a TFT 30 in a demultiplexer circuit DMX.

In the present embodiment, the TFT 30 is an oxide semiconductor TFT which includes an oxide semiconductor layer 7 as the active layer. The TFT 30 has, for example, a top gate structure.

The TFT 30 is supported by a substrate 1 and includes an oxide semiconductor layer 7, a gate insulating layer 9, an upper gate electrode 11, a first electrode 13 and a second electrode 15.

The oxide semiconductor layer 7 is provided on the substrate 1. The oxide semiconductor layer 7 may be provided on an insulating layer 5 which is formed on the substrate 1. The oxide semiconductor layer 7 includes, for example, an In—Ga—Zn—O based semiconductor.

The gate insulating layer 9 is provided on a part of the oxide semiconductor layer 7. The gate insulating layer 9 may be provided only in a region overlapping the upper gate electrode 11 so as to have an island shape.

The upper gate electrode 11 is provided on the gate insulating layer 9. The upper gate electrode 11 opposes the oxide semiconductor layer 7 via the gate insulating layer 9.

The oxide semiconductor layer 7, the gate insulating layer 9 and the upper gate electrode 11 are covered with a first interlayer insulating layer 21 and a second interlayer insulating layer 23. The second interlayer insulating layer 23 is provided on the first interlayer insulating layer 21.

The first electrode 13 and the second electrode 15 are each electrically coupled with the oxide semiconductor layer 7. One of the first electrode 13 and the second electrode 15 functions as the source electrode, and the other functions as the drain electrode.

In the present embodiment, the first electrode 13 and the second electrode 15 are provided in different electrically-conductive layers. In this example, the first electrode 13 is provided between the first interlayer insulating layer 21 and the second interlayer insulating layer 23 and is connected with the oxide semiconductor layer inside a first contact hole CH1 formed in the first interlayer insulating layer 21. The second electrode 15 is provided on the second interlayer insulating layer 23. The second electrode 15 is connected with the oxide semiconductor layer 7 inside a second contact hole CH2 formed in the first interlayer insulating layer 21 and the second interlayer insulating layer 23. This can reduce the gap between the first electrode 13 and the second electrode 15 (source-drain distance wS) as will be specifically described later, and therefore, the width in the channel length direction of the TFT 30, wT, can be reduced.

In this specification, an electrically-conductive layer which is provided on the upper gate electrode 11 with an insulating film interposed therebetween and which includes the first electrode 13 is referred to as "lower electrically-conductive layer". An electrically-conductive layer which is provided on the lower electrically-conductive layer with an insulating film interposed therebetween and which includes the second electrode 15 is referred to as "upper electrically-conductive layer". The lower electrically-conductive layer may be a source metal layer which is formed by the same electrically-conductive film as the source bus lines SL (FIG. 1), that is, which includes the source bus lines SL. The upper electrically-conductive layer may be a transparent electrically-conductive layer which is formed using the same transparent electrically-conductive film as the pixel electrode or the common electrode. Alternatively, in the display region, when a metal auxiliary line which has lower resistance than the common electrode is provided so as to be in contact with the common electrode, the upper electrically-conductive layer may be a metal layer which is formed using the same metal film as the metal auxiliary line.

In this specification, a part of the oxide semiconductor layer 7 which is in contact with the first electrode 13 is referred to as "first contact region 7a", and a part of the oxide semiconductor layer 7 which is in contact with the second electrode 15 is referred to as "second contact region 7b". A region which is present between the first contact region 7a and the second contact region 7b and which overlaps the upper gate electrode 11 when viewed in the normal direction of the substrate 1 is referred to as "the channel region 7c". The oxide semiconductor layer 7 may further include an offset region 7off which is present between the channel region 7c and the first contact region 7a and/or the second contact region 7b. In this specification, in a plane parallel to the substrate 1, a direction DL parallel to the flowing direction of the electric current in the channel region 7c is referred to as "channel length direction", and a direction DW perpendicular to the channel length direction DL is referred to as "channel width direction". A length in the channel length direction DL of the channel region 7c is the channel length L, and a length in the channel width direction DW of the channel region 7c is channel width W. In this example, the channel length direction DL is a direction extending between an edge portion p1 on the channel region 7c side of the first electrode 13 and an edge portion p2 on the channel region 7c side of the second electrode 15 (with the shortest distance).

Portions of the oxide semiconductor layer 7 which do not overlap the upper gate electrode 11 when viewed in the normal direction of the substrate 1, i.e., the first contact region 7a, the second contact region 7b and the offset region 7off, may have lower electric resistance than the channel region 7c. Such a configuration is realized by forming an insulating film which deoxidizes the oxide semiconductor, as the first interlayer insulating layer 21, so as to be in contact with the first contact region 7a, the second contact region 7b and the offset region 7off. Alternatively, a resistance-reduction treatment, such as plasma treatment, may be performed on the oxide semiconductor layer 7 using the upper gate electrode 11 as a mask.

The gate insulating layer 9 may be provided only between the oxide semiconductor layer 7 and the upper gate electrode 11. This allows the channel region 7c of the oxide semiconductor layer 7 and regions other than the channel region (the offset region 7off, the contact regions 7a, 7b) to be in contact with different insulating films. In one example, when the gate insulating layer 9 is formed using an oxide film such as an silicon oxide film, oxidation deficiencies in the channel region 7c of the oxide semiconductor layer 7 can be reduced by the oxide film, so that desired TFT characteristics can be ensured. When the first interlayer insulating layer 21 is formed using an insulating film which deoxidizes the oxide semiconductor, such as a silicon nitride film, the oxide semiconductor in the offset region 7off of the oxide semiconductor layer 7 which is in contact with the first interlayer insulating layer 21 is deoxidized so that oxidation deficiencies increase. As a result, the carrier concentration increases, and the resistance decreases. Therefore, the decrease of the on resistance can be suppressed.

The upper gate electrode 11 and the gate insulating layer 9 may be patterned, for example, using the same mask. In this case, when viewed in the normal direction of the substrate 1, the perimeter of the gate bus line GL or the upper gate electrode 11 and the perimeter of the gate insulating layer 9 may be in alignment with each other. The general entirety of the lower surface of the upper gate electrode 11 may be in contact with the gate insulating layer 9.

<Effects Achieved by TFT Structure>

As illustrated in FIGS. 3A and 3B, in the demultiplexer circuit DMX of the present embodiment, the source electrode and the drain electrode of the TFT 30 are provided in different layers. The effects achieved by this structure are described by comparison with a TFT whose source and drain electrodes are provided in the same layer (a TFT of a reference example).

Figure 12A:
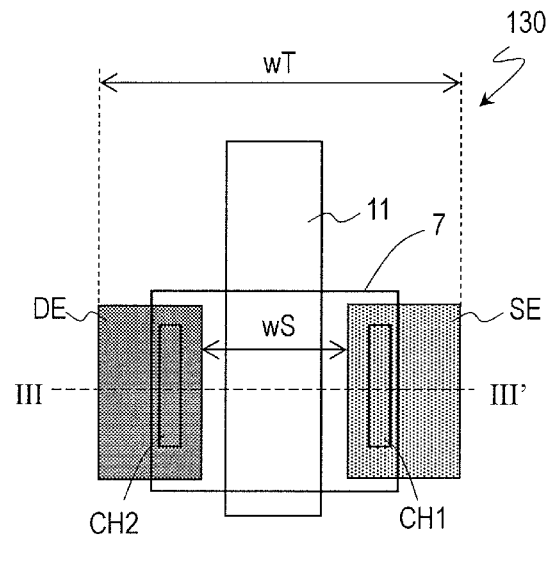
FIGS. 12A and 12B are, respectively, a plan view and a cross-sectional view illustrating a DMX circuit TFT 130 of a reference example.
Figure 12B:
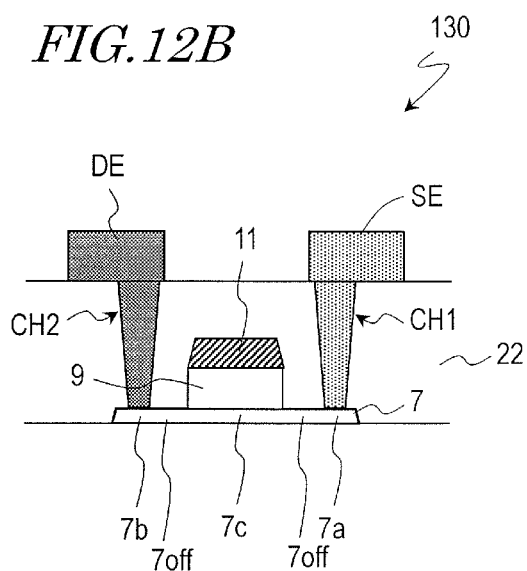

FIGS. 12A and 12B are, respectively, a plan view and a cross-sectional view showing a TFT 130 of a reference example. In FIGS. 12A and 12B, the same components as those of FIGS. 3A and 3B are designated with the same reference numerals.

In the TFT 130 of the reference example, an interlayer insulating layer 22 is provided so as to cover the oxide semiconductor layer 7, the gate insulating layer 9 and the upper gate electrode 11. On the interlayer insulating layer 22, a source electrode SE and a drain electrode DE are provided. The source electrode SE and the drain electrode DE are provided in the same electrically-conductive layer. For example, the source electrode SE and the drain electrode DE are formed by patterning the same electrically-conductive film as the source bus lines SL. The source electrode SE and the drain electrode DE are spaced away from each other by a gap (hereinafter, "source-drain distance wS").

In the TFT 130 of the reference example, the width of the source electrode SE and the drain electrode DE (wire width) and the lower limits of the source-drain distance wS and other dimensions (design values) are determined by process restrictions (line and space restrictions). For example, if the source-drain distance wS is excessively short, there is a probability that the source electrode SE and the drain electrode DE will come into contact with each other due to misalignment, leading to an operation failure. Also, there is a probability that the overlap capacitance between the source electrode SE and the drain electrode DE and the upper gate electrode 11 will increase. In view of such, usually, the source electrode SE and the drain electrode DE are each arranged so as not to overlap the gate electrode 11 (i.e., the channel region 7c) when viewed in the normal direction of the substrate 1. Therefore, it is difficult to reduce the width in the channel length direction of the TFT 130, wT.

According to research conducted by the present inventors, it is estimated that when in a demultiplexer circuit DMX, for example, a DMX circuit TFT is provided between two adjoining source bus lines such that a direction in which the source bus lines SL extend is parallel to the channel width direction, a DMX circuit TFT which has a large channel width can be provided while suppressing the increase of the circuit area. However, when the TFT 130 of the reference example is used, particularly in a high-resolution active matrix substrate in which the arrangement pitch of the source bus lines SL is small (e.g., not more than 10 μm), it is sometimes difficult to provide a DMX circuit TFT in a space between the source bus lines SL.

On the other hand, in the TFT 30 of the present embodiment, the first electrode 13 and the second electrode 15 are provided in different electrically-conductive layers which are separated by the second interlayer insulating layer 23. Therefore, the source-drain distance wS (the distance between the edge portion p1 of the first electrode 13 and the edge portion p2 of the second electrode 15) can be designed narrower (e.g., wS<2 μm). Thus, the width wT in the channel length direction can be designed smaller than in the TFT 130 of the reference example. Note that, in the present embodiment, the first electrode 13 and the second electrode 15 may partially overlap each other when viewed in the normal direction of the substrate 1 (i.e., wS=0). Also in that case, a failure due to source-drain conduction would not occur so long as the edge portion p1 of the first electrode 13 does not come into contact with the second electrode 15 inside the contact hole CH2.

The first electrode 13 and/or the second electrode 15 of the TFT 30 may be designed so as to overlap the upper gate electrode 11 when viewed in the normal direction of the substrate 1. This allows the width in the channel length direction of the TFT 30, wT, to be further reduced. According to the present embodiment, the insulating film lying between the second electrode 15 and the upper gate electrode 11 can have a large thickness. Therefore, the parasitic capacitance resulting from the overlap of the second electrode 15 and the upper gate electrode 11 (capacitance Cgd if the second electrode 15 is the drain electrode) can be reduced as compared with a case where the second electrode 15 is provided on the first interlayer insulating layer 21. Thus, the width in the channel length direction of the TFT 30, wT, can be reduced while suppressing the increase of the parasitic capacitance.

The lengths in the channel length direction DL of overlapping portions of the first electrode 13 and the second electrode 15 with the upper gate electrode 11, xa, xb, can be set in consideration of the largeness of the capacitances formed by the first electrode 13 or the second electrode 15 and the upper gate electrode 11 and the insulating layers provided between these electrodes, the processing accuracy, and other relevant factors.

Preferably, the overlap capacitance (parasitic capacitance) is smaller on the drain side of the TFT 30 than on the source side. From this viewpoint, the first electrode 13 may be the source electrode, and the second electrode 15 may be the drain electrode. This can make the parasitic capacitance Cdg between the upper gate electrode 11 and the drain electrode smaller than the parasitic capacitance Csg between the upper gate electrode 11 and the source electrode.

Thus, according to the present embodiment, the design flexibility increases, and the width in the channel length direction of the TFT 30, wT, can be reduced as compared with conventional TFTs. When the width wT in the channel length direction is reduced, for example, even in a high-resolution active matrix substrate, the TFT 30 can be provided between adjoining source bus lines SL, and the TFT 30 can be applied to a two-stage demultiplexer circuit which will be described later. Therefore, the area of the demultiplexer circuit DMX can be designed small, and narrowing of the frame can be realized.

The oxide semiconductor TFT usually has such a problem that, due to entry of light into the oxide semiconductor layer, the threshold value shifts, and deterioration can occur. In the TFT 130 of the reference example, a part of the offset region 7off of the oxide semiconductor layer 7 is not covered with any of the upper gate electrode 11, the source electrode SE and the drain electrode DE. Therefore, there is a probability that light coming from above will impinge on the offset region 7off and cause deterioration.

On the other hand, according to the present embodiment, the offset region 7off of the oxide semiconductor layer 7 of the TFT 30 is covered with the first electrode 13 or the second electrode 15, and therefore, light coming from above is unlikely to impinge on the oxide semiconductor layer 7. Thus, light deterioration of the oxide semiconductor layer 7 can be suppressed. Note that light traveling from the substrate 1 side toward the oxide semiconductor layer 7 can be prevented from impinging on the oxide semiconductor layer 7 by providing, for example, a light shielding layer or lower electrode between the substrate 1 and the oxide semiconductor layer 7.

<Manufacturing Method of TFT 30>

The TFT 30 shown in FIGS. 3A and 3B can be manufactured, for example, as described below.

First, a substrate 1 is provided. As the substrate 1, for example, a glass substrate, a silicon substrate, a heat-resistant plastic substrate (resin substrate), or the like, can be used. As the plastic or resin substrate, polyethylene terephthalate (PET), polyethylene naphthalate (PEN), polyether sulfone (PES), acryl, polyimide, or the like, can be used.

Then, on the substrate 1, an insulating layer 5 is formed as an underlayer insulating film. As the insulating layer 5, silicon oxide (SiOx), silicon nitride (SiNx), silicon oxynitride (SiOxNy; x>y), silicon nitroxide (SiNxOy; x>y), or the like, can be appropriately used. Herein, as the insulating layer 5, a $SiO_2$ film (thickness: 375 nm) is formed by CVD.

Then, on the insulating layer 5, an oxide semiconductor film (thickness: for example, not less than 30 nm and not more than 100 nm) is formed by, for example, sputtering. The oxide semiconductor film is not particularly limited but may be, for example, an In—Ga—Zn—O based semiconductor film. Thereafter, the oxide semiconductor film is patterned through a known photolithography process such that an oxide semiconductor layer 7 in the shape of an island is formed.

Thereafter, a gate insulating film and an electrically-conductive film for the upper gate (hereinafter, "upper gate electrically-conductive film") are formed so as to cover the oxide semiconductor layer 7.

As the gate insulating film, a silicon oxide (SiOx) layer, a silicon nitride (SiNx) layer, a silicon oxynitride (SiOxNy; x>y) layer, a silicon nitroxide (SiNxOy; x>y) layer, an aluminum oxide layer or a tantalum oxide layer can be appropriately used. The gate insulating layer 9 may have a multilayer structure. Herein, as the gate insulating film, a silicon oxide (SiOx) layer (thickness: not less than 80 nm and not more than 250 nm; for example, 150 nm) is formed by CVD.

As the upper gate electrically-conductive film, for example, a metal film which includes an element selected from the group consisting of aluminum (Al), tungsten (W), molybdenum (Mo), tantalum (Ta), chromium (Cr), titanium (Ti) and copper (Cu), an alloy film which includes any of these elements as a constituent, or the like, may be used. Alternatively, a multilayer film which includes a plurality of such films may be used. Herein, as the upper gate electrically-conductive film, a multilayer film which includes an Al film (thickness: 350 nm) as the lower layer and a MoN film (thickness: 50 nm) as the upper layer is formed by sputtering.

Then, etching of the upper gate electrically-conductive film and the gate insulating film is carried out to form an upper gate electrode 11 and a gate insulating layer 9. Herein, a resist mask is formed on the upper gate electrically-conductive film, and the upper gate electrically-conductive film and the gate insulating film are concurrently etched (herein, dry etching) using the resist mask. Thus, a portion of the gate insulating film which is not covered with the upper gate electrode 11 is removed.

Thereafter, a plasma treatment is performed on the entire surface of the substrate 1 from above the upper gate electrode 11. For example, a hydrogen plasma treatment or a He plasma treatment is performed. In this case, the upper gate electrode 11 serves as a mask, and therefore, the resistance is reduced by the plasma treatment only in a region of the oxide semiconductor layer 7 which is not covered with the upper gate electrode 11.

Then, a first interlayer insulating layer 21 (thickness: for example, not less than 100 nm and not more than 500 nm) is formed so as to cover the oxide semiconductor layer 7, the gate insulating layer 9 and the upper gate electrode 11. The first interlayer insulating layer 21 can be realized by a single layer or a multilayer structure of a silicon oxide film, a silicon nitride film, a silicon oxynitride film, and a silicon nitroxide film. Herein, as the first interlayer insulating layer 21, a SiNx (thickness: 100 nm) film and a $SiO_2$ film (thickness: 300 nm) are continuously formed by CVD.

After the patterning of the upper gate electrode 11 and the gate insulating layer 9, an insulating film which deoxidizes the oxide semiconductor (e.g., a nitride film such as SiNx) may be formed as the first interlayer insulating layer 21 so as to be in contact with a portion of the upper surface of the oxide semiconductor layer 7 which is exposed from the upper gate electrode 11. As a result, the exposed portion of the oxide semiconductor layer 7 is deoxidized so as to have a reduced resistance (self-alignment structure). In this case, the above-described plasma treatment may not be carried out.

Thereafter, through a known photolithography process, a contact hole CH1 is formed in the first interlayer insulating layer 21 such that a part of the oxide semiconductor layer 7 is exposed.

Then, an electrically-conductive film for the first electrode (hereinafter, "first electrode electrically-conductive film") is formed on the first interlayer insulating layer 21 and in the contact hole CH1 and patterned to form a first electrode 13. As the first electrode electrically-conductive film, the electrically-conductive film which has been illustrated as the upper gate electrode electrically-conductive film can be used. Herein, a multilayer film is used which includes a Ti film (thickness: 30 nm) as the lower layer, an Al film (thickness: 300 nm) as the main layer, and a Ti film (thickness: 50 nm) as the upper layer.

Then, a second interlayer insulating layer 23 (thickness: for example, not less than 100 nm and not more than 500 nm) is formed so as to cover the first electrode 13. As the second interlayer insulating layer 23, an insulating film which is similar to the first interlayer insulating layer 21 can be used. Herein, as the second interlayer insulating layer 23, a SiNx film (thickness: 100 nm) and a $SiO_2$ film (thickness: 300 nm) are continuously formed by CVD.

Thereafter, a contact hole CH2 is formed in the second interlayer insulating layer 23 such that a part of the oxide semiconductor layer 7 is exposed.

Then, an electrically-conductive film for the second electrode (hereinafter, "second electrode electrically-conductive film") is formed on the second interlayer insulating layer 23 and in the contact hole CH2 and patterned to form a second electrode 15. As the second electrode electrically-conductive film, the electrically-conductive film illustrated as the upper gate electrode electrically-conductive film can be used. Herein, a multilayer film is used which includes a Ti film (thickness: 30 nm) as the lower layer, an Al film (thickness: 300 nm) as the main layer, and a Ti film (thickness: 50 nm) as the upper layer. As described hereinabove, a TFT 30 is manufactured. Note that a protection film or flattening film may be formed so as to cover the TFT 30.

Figure 4A:
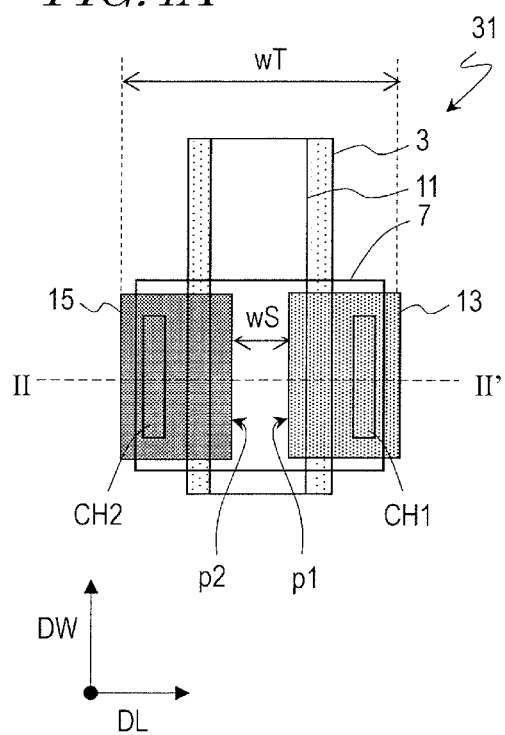
FIGS. 4A and 4B are, respectively, a plan view and a cross-sectional view illustrating an alternative DMX circuit TFT 31 of the first embodiment.
Figure 4B:
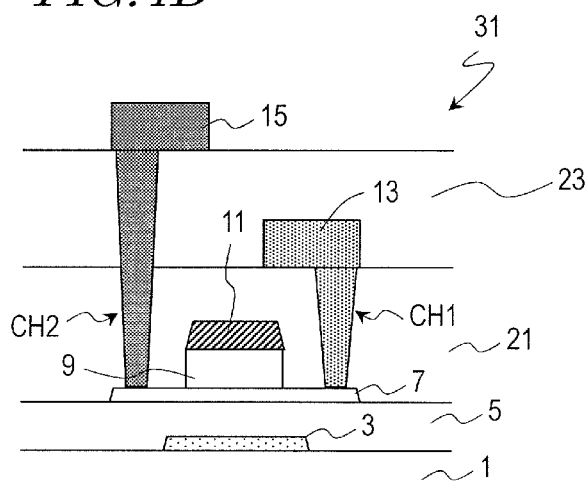

FIGS. 4A and 4B are, respectively, a plan view and a cross-sectional view illustrating an alternative example of the DMX circuit TFT in the present embodiment.

The TFT 31 shown in FIGS. 4A and 4B is different from the TFT 30 shown in FIGS. 3A and 3B in that the TFT 31 further includes a lower electrode (also referred to as "shield electrode") 3 between the substrate 1 and the insulating layer 5.

The lower electrode 3 is arranged so as to overlap at least the channel region 7c when viewed in the normal direction of the substrate 1. The lower electrode 3 may be a metal layer. In this case, the lower electrode 3 can also function as a light shielding layer for the TFT 31. For example, the lower electrode 3 may be formed by the same electrically-conductive film as the gate bus lines GL (FIG. 1).

The lower electrode 3 may be fixed to, for example, the GND potential (0 V). In this case, the stability of the characteristics of the TFT 31 can be ensured.

Figure 5:
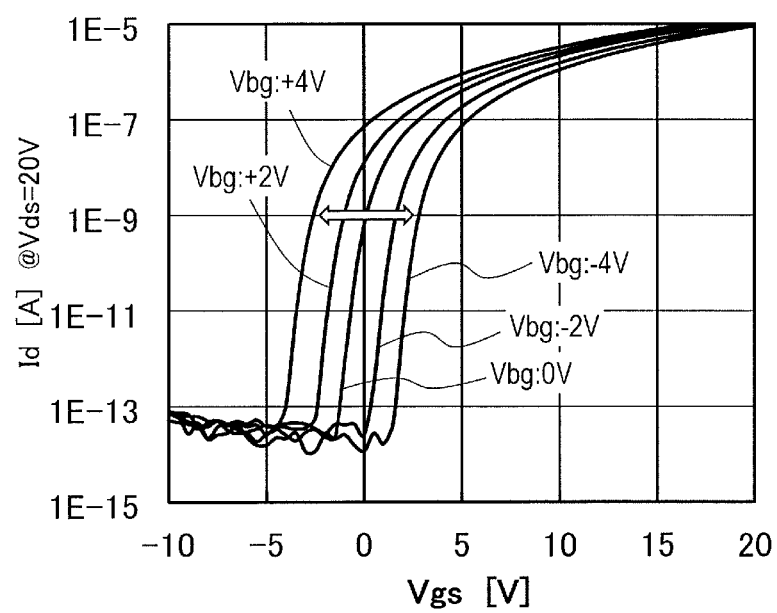
FIG. 5 is a graph showing the dependence of the Vg-Id characteristic of the TFT 31 on the voltage between the lower electrode and the source electrode, Vbg.

Alternatively, the threshold voltage Vth of the TFT 31 can be controlled by adjusting the potential of the lower electrode 3. For example, as illustrated in FIG. 5, when the voltage between the lower electrode 3 and the source electrode, Vbg, is increased in the positive direction, the threshold voltage Vth effectually shifts in the negative direction. Thus, the on current can be increased with the same gate voltage Vgs, and the power consumption by the display panel can be suppressed to a low level.

Further, the lower electrode 3 may be electrically coupled with the upper gate electrode 11 (or the gate bus line) such that the lower electrode 3 is at the same potential as that of the upper gate electrode 11. Such double gate driving allows the on current to be increased, and therefore, the drivability of the TFT 31 can be improved.

The TFT 31 can be manufactured by the same method as the above-described manufacturing method of the TFT 30 except that the lower electrode 3 is formed on the substrate 1.

The lower electrode 3 is formed by forming on the substrate 1 an electrically-conductive film for the lower electrode (hereinafter, "lower electrode electrically-conductive film") (thickness: for example, not less than 50 nm and not more than 500 nm) and patterning the formed electrically-conductive film. As the lower electrode electrically-conductive film, a film which is similar to the upper gate electrode electrically-conductive film can be used. Herein, as the lower electrode electrically-conductive film, a multi-layer film which includes an Al film (thickness: 350 nm) as the lower layer and a MoN film (thickness: 50 nm) as the upper layer is formed by sputtering. Patterning of the lower electrode electrically-conductive film is realized by, for example, dry etching.

Then, an insulating layer 5 is formed so as to cover the lower electrode 3. Thereafter, an oxide semiconductor layer 7, an upper gate electrode 11, a first electrode 13 and a second electrode 15 are formed through the same process as that for the TFT 30, whereby a TFT 31 is obtained.

<Layout Example of Demultiplexer Circuit DMX_A>

Figure 6:
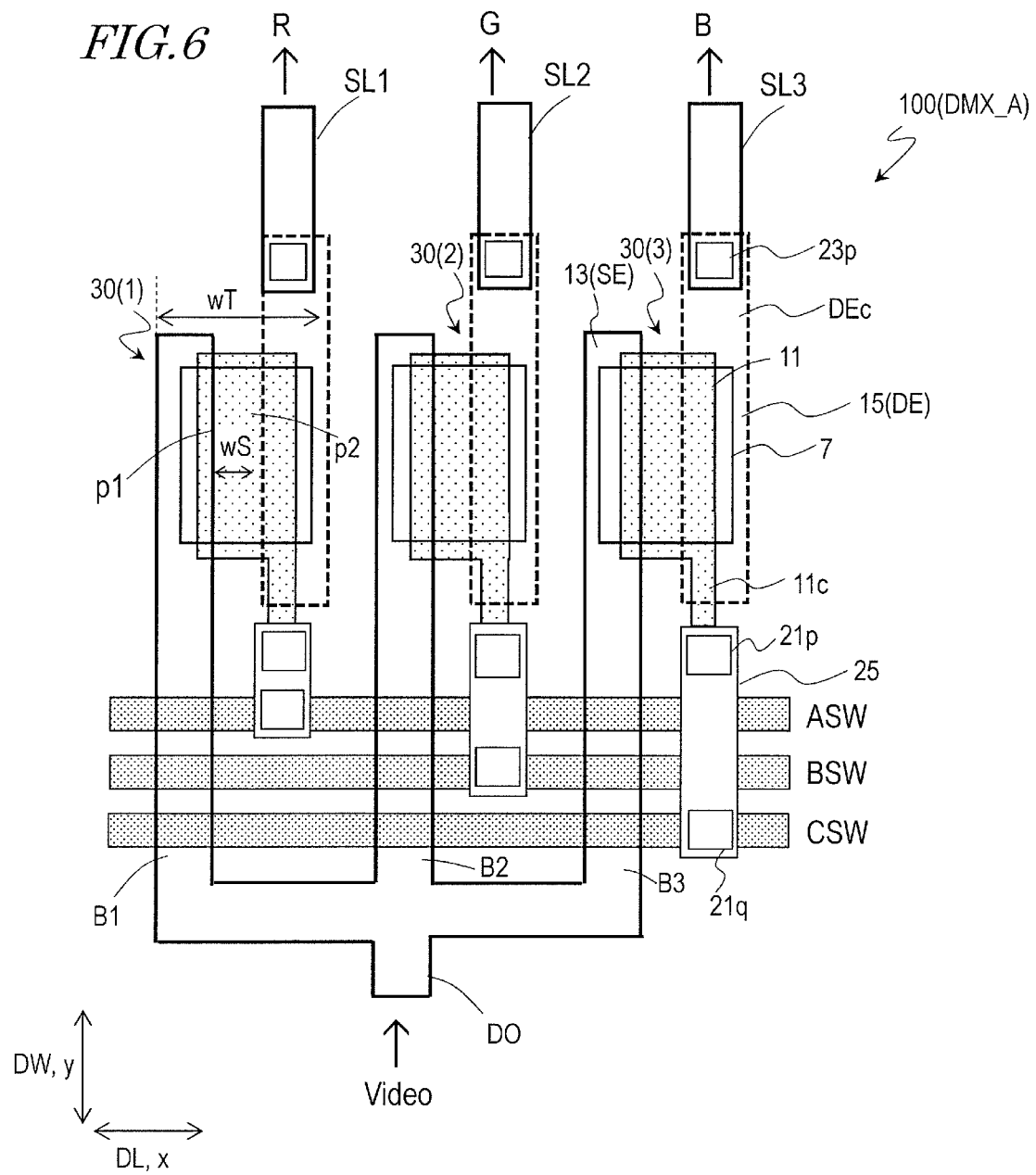
FIG. 6 is a plan view illustrating a layout of a unit circuit 100 in the demultiplexer circuit DMX_A.

FIG. 6 is a plan view illustrating a layout of a unit circuit 100 of the demultiplexer circuit DMX_A. Herein, the unit circuit 100 is provided for source bus lines SL1 to SL3 associated with R, G, B pixels (i.e., n=3).

The unit circuit 100 includes three TFTs 30(1) to 30(3) (hereinafter, also generically referred to as "TFTs 30") supported by the substrate 1, source bus lines SL1 to SL3 (hereinafter, also generically referred to as "source bus lines SL") extending from the display region DR, a single video signal line DO, branch lines B1 to B3 (hereinafter, also generically referred to as "branch lines B"), and control signal main lines ASW to CSW (hereinafter, also generically referred to as "control signal main lines SW"). The video signal line DO is electrically coupled with the branch lines B1 to B3. In this example, the source bus lines SL extend in the y direction, and the control signal main lines SW extend in the x direction which intersects with the y direction.

The TFT 30 has the same configuration as that of the TFT 30 which has previously been described with reference to FIGS. 3A and 3B. In this example, the first electrode 13 provided in the lower electrically-conductive layer is the source electrode SE, and the second electrode 15 provided in the upper electrically-conductive layer is the drain electrode DE. In FIG. 6, the lower electrically-conductive layer is represented by a solid line, and the upper electrically-conductive layer is represented by a broken line.

The TFT 30 may further include a lower electrode 3 on the substrate 1 side of the oxide semiconductor layer 7 as shown in FIGS. 4A and 4B.

The branch lines B, the video signal line DO and the source electrode SE of the TFT 30 may be provided in the source metal layer (i.e., formed using the same electrically-conductive film as the source bus lines SL). The drain electrode DE of the TFT 30 may be provided in an electrically-conductive layer lying above the source metal layer (e.g., transparent electrically-conductive layer).

The control signal main lines SW and the upper gate electrode 11 may be provided in the same electrically-conductive layer, e.g., in the gate metal layer. Alternatively, the control signal main lines SW may be provided in the gate metal layer, and the upper gate electrode 11 may be provided in another electrically-conductive layer interposed between the gate metal layer and the source metal layer.

The source bus lines SL extend in the y direction from the display region to the source driver SD side. Each of the TFTs 30 may be provided between two adjoining source bus lines SL. In this example, the TFT 30 is arranged such that the channel length direction DL is generally parallel to the x direction, and the channel width direction DW is generally parallel to the y direction.

The drain electrode DE and the source electrode SE of the TFT 30 extend so as to traverse the oxide semiconductor layer 7 in the y direction (channel width direction DW) when viewed in the normal direction of the substrate 1.

The drain electrode DE is electrically coupled with a corresponding one of the source bus lines SL. In this example, the drain electrode DE is extended in the Y direction toward the source bus line SL. The extended portion DEc is referred to as "drain extended portion". The drain extended portion DEc is electrically coupled with the source bus line SL inside an opening 23p formed in the second interlayer insulating layer 23.

The source electrode SE is electrically coupled with a corresponding one of the branch lines B. In this example, the branch line B extends in the y direction from the video signal line DO to the display region side when viewed in the normal direction of the substrate 1 and includes a portion which functions as the source electrode SE of the TFT 30. That is, the branch line B and the source electrode SE are integrally formed.

The upper gate electrode 11 of the TFT 30 is electrically coupled with a corresponding one of the control signal main lines SW. In this example, the upper gate electrode 11 is extended in the y direction toward the control signal main line SW. The extended portion 11c is referred to as "gate extended portion". The gate extended portion 11c is electrically coupled with a corresponding one of the control signal main lines SW via the connecting wire formed in the source metal layer. For example, the connecting wire 25 may be in contact with the gate extended portion 11c inside a first opening 21p provided in the first interlayer insulating layer 21 and in contact with the control signal main line SW inside a second opening 21q provided in the first interlayer insulating layer 21 (or the first interlayer insulating layer 21 and the insulating layer 5).

According to the present embodiment, the source electrode SE and the drain electrode DE are provided in different layers, and therefore, the gap between the source electrode SE and the drain electrode DE, wS, can be reduced as described above. As a result, the width in the channel length direction of the TFT 30, wT, can be reduced, and therefore, the TFT 30 can be provided between two adjoining source bus lines SL. The TFT 30 of the present embodiment can be suitably applied when a demultiplexer circuit DMX is formed in a high-resolution active matrix substrate.

The configuration of the demultiplexer circuit DMX of the present embodiment is not limited to the above-described examples. In the TFT 30, the drain electrode DE may be provided in the lower electrically-conductive layer, and the source electrode SE may be provided in the upper electrically-conductive layer. In that case, the drain electrode DE and the source bus line SL may be integrally formed, and the source electrode SE may be connected with the branch line B inside an opening formed in the first interlayer insulating layer 21.

(Variations)

The configuration of the demultiplexer circuit DMX of the present embodiment is not limited to the above-described examples.

The demultiplexer circuit DMX may include a sub-circuit which includes at least two unit circuits (hereinafter, referred to as "first unit circuit" and "second unit circuit"). For example, n source bus lines SL connected with the DMX circuit TFT of the first unit circuit and n source bus lines SL connected with the DMX circuit TFT of the second unit circuit may be arranged alternately in sets of Z source bus lines Z is an integer not less than 1; for example, Z=1) in the row direction.

Figure 7:
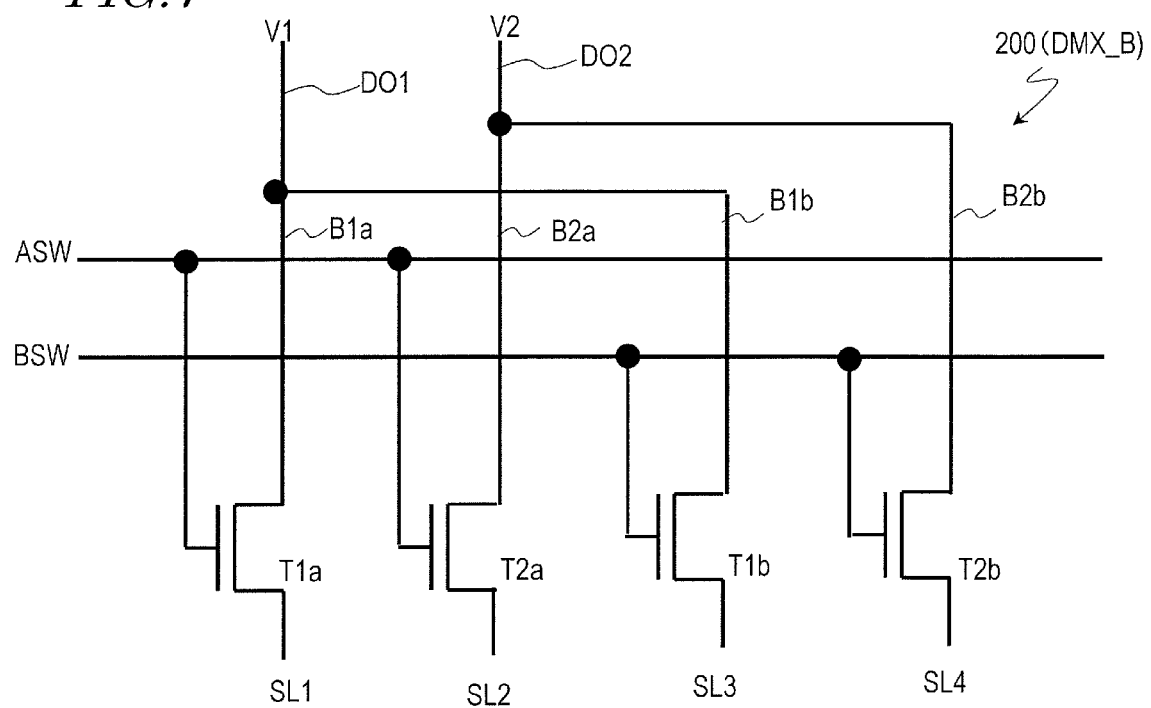
FIG. 7 is a diagram showing a sub-circuit 200 of an alternative demultiplexer circuit DMX_B of the first embodiment.

FIG. 7 is a diagram showing a part of an alternative demultiplexer circuit DMX_B in the present embodiment. FIG. 7 shows a sub-circuit 200 which includes the first unit circuit and the second unit circuit.

In FIG. 7, only four of a plurality of source bus lines SL are shown. These four source bus lines are referred to sequentially from one side (herein, from the left side) as "first source bus line SL1", "second source bus line SL2", "third source bus line SL3" and "fourth source bus line SL4".

The sub-circuit 200 includes first and second unit circuits and a plurality of control signal main lines SW (herein, two control signal main lines ASW, BSW).

In this example, each unit circuit is associated with two source bus lines SL (i.e., n=2). The first unit circuit is associated with the first source bus line SL1 and the third source bus line SL3. The video signal V1 from a corresponding video signal line DO1 is distributed to the first source bus line SL1 and the third source bus line SL3 via the first unit circuit. The second unit circuit is associated with the second source bus line SL2 and the fourth source bus line SL4. The video signal V2 from a video signal line DO2, which is different from that of the first unit circuit, is distributed to the second source bus line SL2 and the fourth source bus line SL4 via the second unit circuit.

The first unit circuit includes two thin film transistors (DMX circuit TFTs) T1a, T1b and two branch lines B1a, B1b. The second unit circuit includes two thin film transistors T2a, T2b and two branch lines B2a, B2b. The thin film transistors T1a, T1b, T2a, T2b have the configuration which has previously been described with reference to FIGS. 3A and 3B and FIGS. 4A and 4B.

The drain electrodes of the thin film transistors T1a, T1b of the first unit circuit are connected with the first source bus line SL1 and the third source bus line SL3, respectively. The source electrodes of the thin film transistors T1a, T1b are connected with the branch lines B1a, B1b, respectively, and are electrically coupled with the video signal line DO1 via the branch lines B1a, B1b.

The drain electrodes of the thin film transistors T2a, T2b of the second unit circuit are connected with the second source bus line SL2 and the fourth source bus line SL4, respectively. The source electrodes of the thin film transistors T2a, T2b are integrally formed with the branch lines B2a, B2b, respectively, and are electrically coupled with the video signal line DO2 via the branch lines B2a, B2b.

The gate electrodes of the thin film transistors T1a, T2a are connected with the control signal main line ASW and are supplied with a control signal from the control signal main lines ASW. The gate electrodes of the thin film transistors T1b, T2b are connected with the control signal main line BSW and are supplied with a control signal from the control signal main lines BSW.

Figure 8:
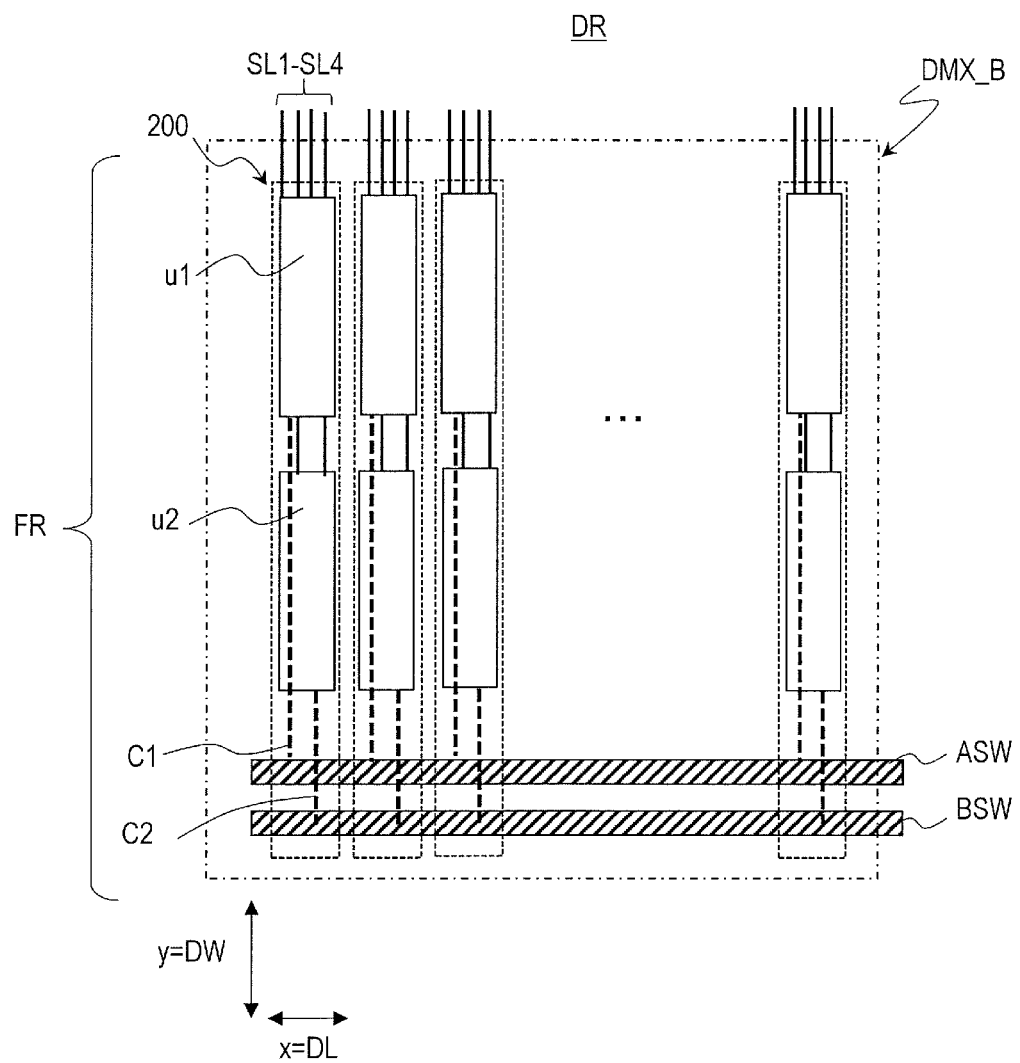
FIG. 8 is a plan view illustrating the outline of a layout of the demultiplexer circuit DMX_B.

FIG. 8 is a plan view illustrating an example of a layout of the demultiplexer circuit DMX_B of the present embodiment. The demultiplexer circuit DMX_B includes a plurality of sub-circuits 200. Each of the sub-circuits 200 includes the first unit circuit and the second unit circuit as previously described with reference to FIG. 7. The first unit circuit and the second unit circuit are each associated with two source bus lines SL.

As shown in the drawing, the plurality of sub-circuits 200 in the demultiplexer circuit DMX_B may be arranged in the x direction when viewed in the normal direction of the substrate 1. Each of the sub-circuits 200 may have a shape elongated in the y direction. In each of the sub-circuits 200, the first unit circuit formation region u1 in which the DMX circuit TFT of the first unit circuit is provided is located on the display region side of the second unit circuit formation region u2 in which the DMX circuit TFT of the second unit circuit is provided. That is, the first unit circuit may reside between the second unit circuit and the display region. In this specification, such a configuration is referred to as "two-stage configuration".

Each of the sub-circuits 200 of the demultiplexer circuit DMX_B includes n (herein, two) control signal branch lines C1, C2. The control signal branch lines C1, C2 are electrically coupled with the control signal main lines ASW, BSW, respectively. In each of the sub-circuits 200, the first unit circuit and the second unit circuit share the control signal branch lines C1, C2.

Although not shown, a COG-mounted source driver is provided between the demultiplexer circuit DMX_B and the perimeter of the non-display region FR. The control signal main lines SW and the video signal line DO are provided between, for example, the demultiplexer circuit DMX_B and the source driver. The control signal main lines ASW, BSW may extend in the x direction.

According to this variation, it is possible to provide a control signal branch line C which is common to two or more unit circuits. Due to this configuration, the area required for the demultiplexer circuit DMX can be effectively reduced. By increasing the channel width W in the y direction, the current drivability can be further improved. Although an example of the two-stage configuration has been described herein, a configuration of three or more stages can be employed.

<Layout Example 1 of Sub-Circuit 200>

Figure 9:
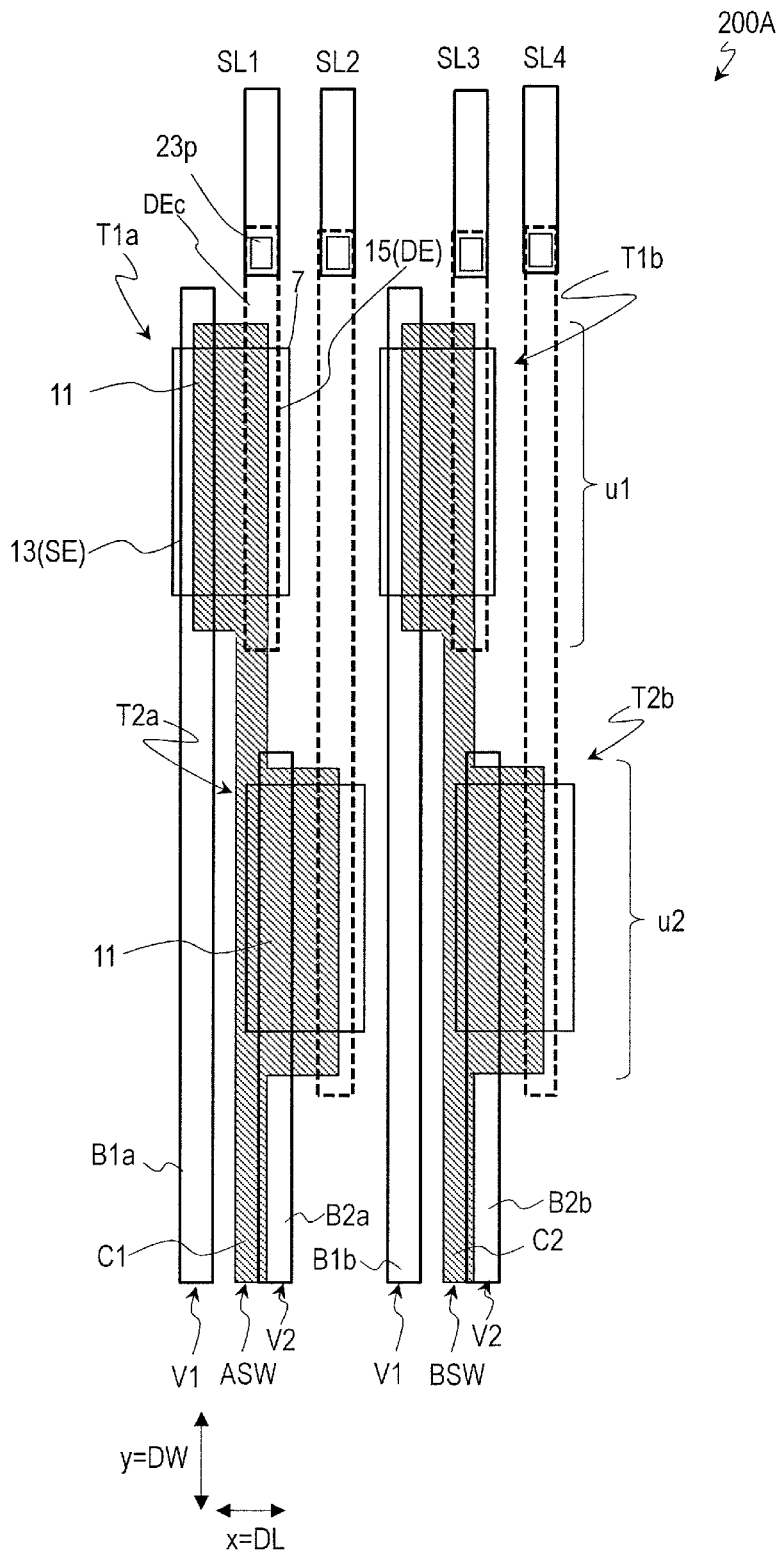
FIG. 9 is a plan view illustrating an example of a layout of a sub-circuit 200A in the demultiplexer circuit DMX_B.

FIG. 9 is an enlarged plan view illustrating a layout of a sub-circuit 200A in the demultiplexer circuit DMX_B. In this example, in each thin film transistor, the source electrode SE is provided in the lower electrically-conductive layer (e.g., source metal layer), and the drain electrode DE is provided in the upper electrically-conductive layer (e.g., transparent electrically-conductive layer). In FIG. 9, the lower electrically-conductive layer is represented by a solid line, and the upper electrically-conductive layer is represented by a broken line.

The first unit circuit includes thin film transistors T1a, T1b provided in the first unit circuit formation regions u1 and branch lines B1a, B1b. The second unit circuit includes thin film transistors T2a, T2b provided in the second unit circuit formation regions u2 and branch lines B2a, B2b. The first and second unit circuits further include common control signal branch lines C1, C2. Herein, the thin film transistors T1a, T2a adjoining in the y direction share the control signal branch line C1, and the thin film transistors T1b, T2b adjoining in the y direction share the control signal branch line C2. The control signal branch lines C1, C2 are electrically coupled with the control signal main lines ASW, BSW, respectively.

The branch lines B1a, B2a, B1b, B2b (also generically referred to as "branch lines B"), the control signal branch lines C1, C2 and the source bus lines SL1 to SL4 of the first unit circuit and the second unit circuit each extend in the y direction. In this example, in each thin film transistor, the channel length direction DL is generally parallel to the x direction, and the channel width direction DW is generally parallel to the y direction.

The control signal branch lines C1, C2 each include a portion which functions as the gate electrode of a corresponding DMX circuit TFT. For example, the control signal branch line C1 resides between the branch line B1a and the branch line B2a when viewed in the normal direction of the substrate 1. The control signal branch line C1 includes protrusions which protrude in the x direction to the branch line B2a side and which function as the gate electrodes of the thin film transistors T2a and protrusions which protrude in the x direction to the branch line B2a side and which function as the gate electrodes of the thin film transistors T1a. The oxide semiconductor layers 7 of the thin film transistor T1a and the thin film transistor T2a are respectively provided on these protrusions of the control signal branch line C1. That is, one of the DMX circuit TFTs in the first unit circuit and one of the DMX circuit TFTs in the second unit circuit have gate electrodes which are integrally formed with an identical control signal branch line C, and are provided on the identical control signal branch line C so as to be spaced away from each other (two-stage configuration).

In this example, the source electrode, the branch line B and the video signal line DO of each thin film transistor are provided in the source metal layer. The source electrode is formed integrally with a corresponding branch line B. The drain electrode of each thin film transistor is provided in an electrically-conductive layer lying above the source metal layer (e.g., transparent electrically-conductive layer). The drain extended portion DEc extended from the drain electrode is connected with a corresponding source bus line SL provided in the source metal layer between the demultiplexer circuit DMX_B and the display region. The upper gate electrode 11 and the control signal main line SW may be provided in the same electrically-conductive layer (e.g., gate metal layer). Alternatively, the control signal main line SW may be provided in the gate metal layer, and the upper gate electrode 11 may be provided in another electrically-conductive layer interposed between the gate metal layer and the source metal layer.

When viewed in the normal direction of the substrate 1, the DMX circuit TFT of the first unit circuit is provided between the $N^{th}$ and $(N+2)^{th}$ source bus lines SL associated with the second unit circuit (N is a natural number). For example, the thin film transistor T1b is provided between the second source bus line SL2 and the fourth source bus line SL4. The DMX circuit TFT of the second unit circuit is provided between two adjoining branch lines B in the first unit circuit. For example, the thin film transistor T2a is provided between the branch lines B1a, B1b of the first unit circuit.

<Layout Example 2 of Sub-Circuit 200>

Some of the plurality of DMX circuit TFTs included in the demultiplexer circuit DMX may be the first TFTs of which the source electrode is in a layer lower than the drain electrode, and some others of the DMX circuit TFTs may be the second TFTs of which the source electrode is in a layer higher than the drain electrode. For example, when another electrode wire is provided between two DMX circuit TFTs, one of the DMX circuit TFTs may be the first TFT, and the other DMX circuit TFT may be the second TFT. Thus, if the first TFT and the second TFT are adjacently provided such that other electrodes and wires are interposed therebetween, the electrodes inside each TFT and the other electrodes and wires can be formed in different layers. Therefore, the gap between these TFTs can be further narrowed.

Figure 10:
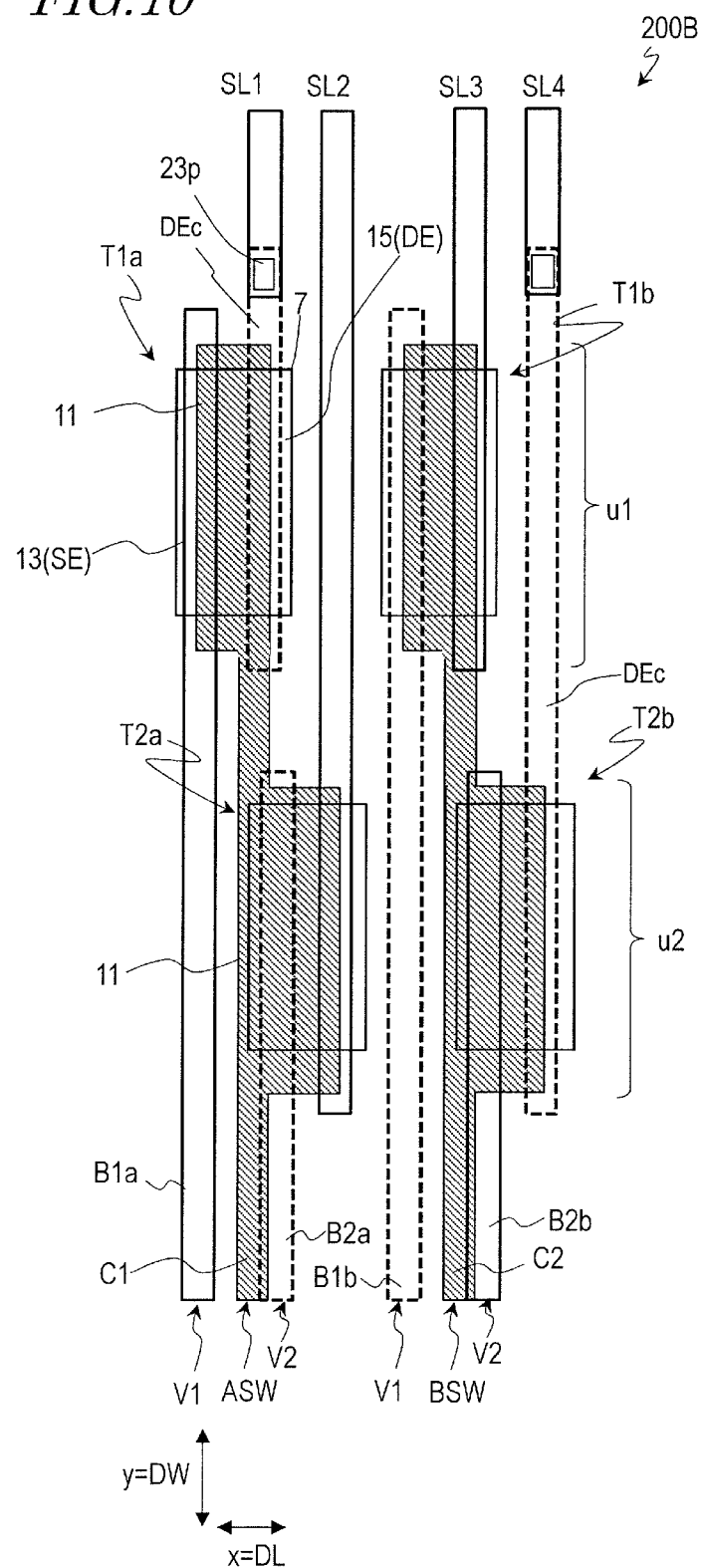
FIG. 10 is a plan view illustrating another example of a layout of a sub-circuit 200B in the demultiplexer circuit DMX_B.

FIG. 10 is a plan view illustrating another example of a layout of a sub-circuit 200B in the demultiplexer circuit DMX_B. In FIG. 10, the lower electrically-conductive layer is represented by a solid line, and the upper electrically-conductive layer is represented by a broken line.

In this example, each unit circuit includes the first TFT and the second TFT. The source electrode of the first TFT is provided in the lower electrically-conductive layer (e.g., source metal layer). The drain electrode of the first TFT is provided in the upper electrically-conductive layer (e.g., transparent electrically-conductive layer). The source electrode of the second TFT is provided in the upper electrically-conductive layer. The drain electrode of the second TFT is provided in the lower electrically-conductive layer. Hereinafter, the differences from the layout of the sub-circuit 200A shown in FIG. 9 are mainly described, and the description of the same constituents will be properly omitted.

In each sub-circuit 200B, two TFTs adjoining in the y direction may have different configurations, and two TFTs adjoining in the x direction may have different configurations. In this example, the thin film transistors T1a, T1b in the first unit circuit are the first TFT and the second TFT, respectively. The thin film transistors T2a, T2b in the second unit circuit are the second TFT and the first TFT, respectively.

The branch lines B, the video signal line DO, the source electrode of the first TFT and the drain electrode of the second TFT are provided in, for example, the source metal layer. The drain electrode of the first TFT and the source electrode of the second TFT are provided in an electrically-conductive layer lying above the source metal layer (e.g., transparent electrically-conductive layer).

The source electrode of the first TFT may be formed integrally with a corresponding branch line B. The drain electrode of the first TFT includes a drain extended portion DEc extending in the y direction. The drain extended portion DEc may be connected with a corresponding source bus line SL provided in the source metal layer between the demultiplexer circuit DMX_B and the display region.

The source electrode of the second TFT includes a source extended portion SEc extending in the y direction. The source extended portion SEc may be connected with a corresponding branch line B between the demultiplexer circuit DMX_B and the source driver. The drain electrode of the second TFT may be formed integrally with a corresponding source bus line SL.

According to such a layout, in the demultiplexer circuit DMX_B, electrodes and wires provided in the upper electrically-conductive layer and electrodes and wires provided in the lower electrically-conductive layer can be alternately arranged. Thus, the gap between adjoining electrodes and wires can be further narrowed, and the circuit area can be further reduced.

For example, in the first unit circuit region, the source electrode of the thin film transistor T1a in the lower electrically-conductive layer, the drain electrode of the thin film transistor T1a in the upper electrically-conductive layer, the second source bus line SL2 in the lower electrically-conductive layer, the source electrode of the thin film transistor T1b in the upper electrically-conductive layer, the drain electrode of the thin film transistor T1b in the lower electrically-conductive layer, and the drain extended portion DEc of the thin film transistor T2b in the upper electrically-conductive layer are arranged in this order from left. Thus, not only the source-drain distance wS of each thin film transistor but also the gap between two adjoining thin film transistors can be reduced.

The thin film transistors T1a, T1b of the first unit circuit may be the second TFTs, and the thin film transistors T2a, T2b of the second unit circuit may be the first TFTs. Although an example of the two-stage configuration has been described herein, a configuration of three or more stages can be employed.

(Configuration of Pixel Region P)

Next, the configuration of each pixel region P in the active matrix substrate 1000 is described. Herein, the configuration of the pixel region P is described with an example of the active matrix substrate applied to a FFS mode LCD panel.

Figure 11A:
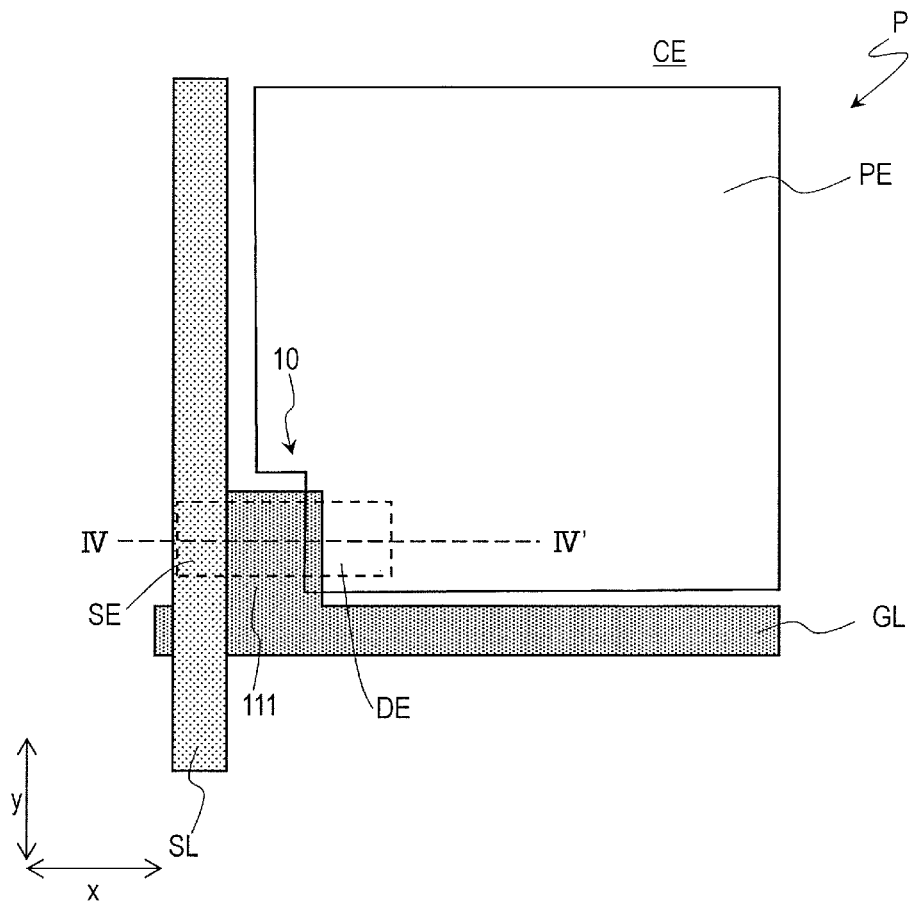
FIGS. 11A and 11B are, respectively, a plan view of a pixel region P in the active matrix substrate 1000 and a cross-sectional view of the pixel region P taken along line IV-IV'.
Figure 11B:
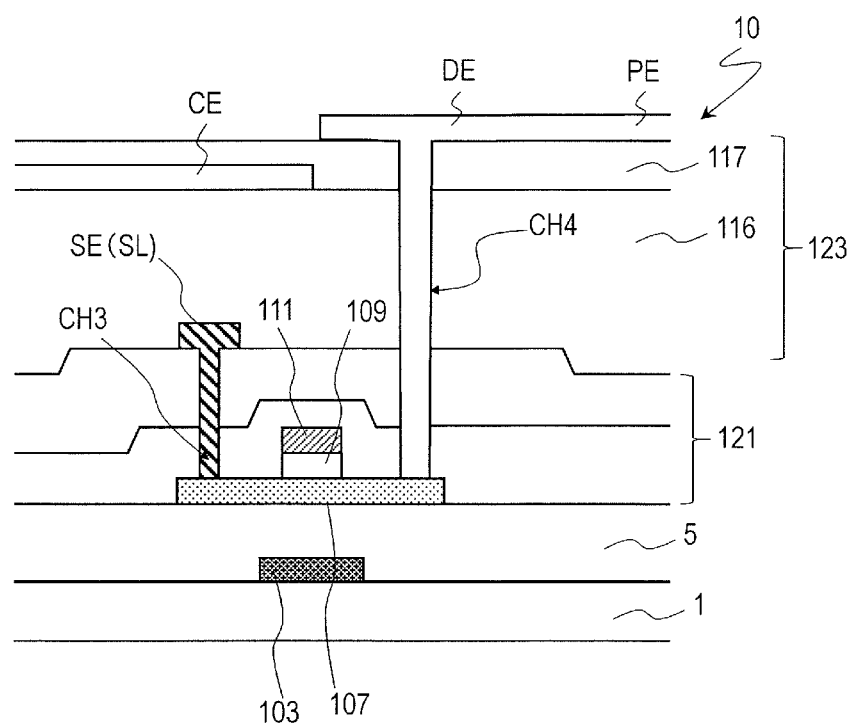

FIGS. 11A and 11B are, respectively, a plan view of a single pixel region P in the active matrix substrate 1000 and a cross-sectional view of the pixel region P taken along line IV-IV'.

The pixel region P is a region surrounded by source bus lines SL extending in the y direction and gate bus lines GL extending in the x direction so as to intersect with the source bus lines SL. The pixel region P includes a substrate 1, a TFT (hereinafter, "pixel TFT") 10 supported by the substrate 1, a lower transparent electrode 115, and an upper transparent electrode 119. Although not shown, the upper transparent electrode 119 has a slit or notch in each pixel. In this example, the lower transparent electrode 115 is a common electrode CE, and the upper transparent electrode 119 is a pixel electrode PE.

Figure 13:
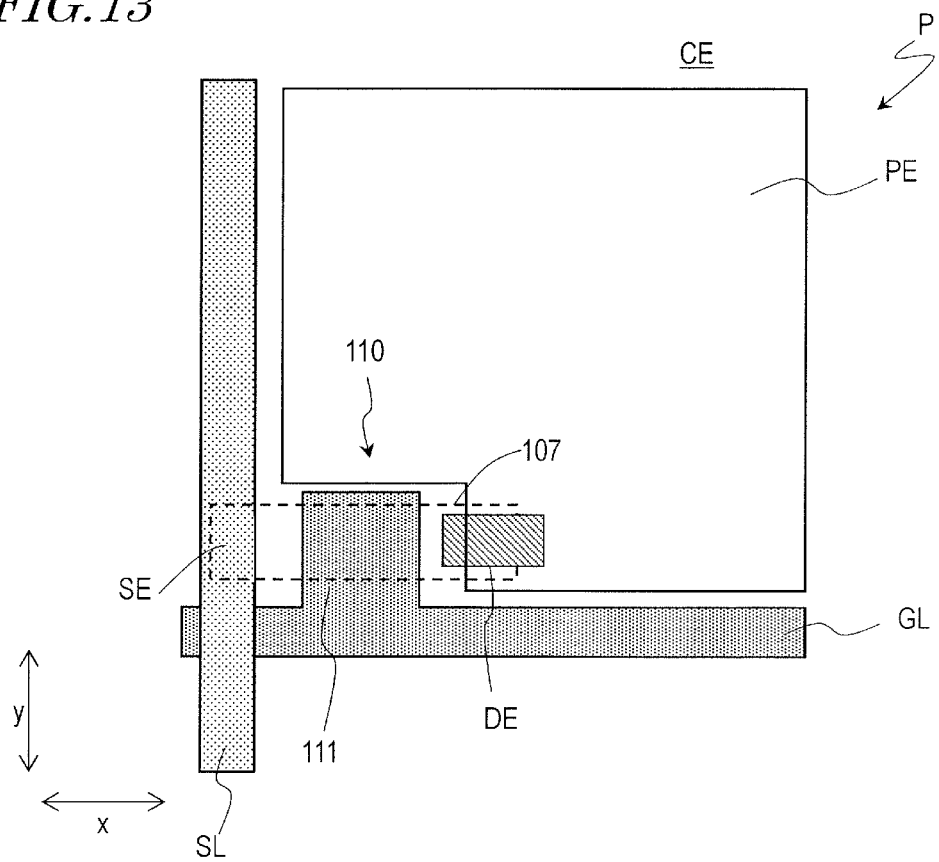
FIG. 13 is a plan view illustrating a comparative example of a pixel region.

The pixel TFT 10 is a top gate structure TFT or double gate structure TFT of which the source electrode SE and the drain electrode DE are provided in different electrically-conductive layers as is the DMX circuit TFT. When the source electrode SE and the drain electrode DE of the pixel TFT 10 are provided in different electrically-conductive layers, the gap between the pixel electrode PE and the source bus lines SL can be reduced. Further, the upper gate electrode 111 may partially overlap the pixel electrode PE and the source bus lines SL when viewed in the normal direction of the substrate 1. This arrangement allows the pixel TFT 10 to be placed under the intersection of the source bus line SL and the gate bus line GL. Therefore, the pixel aperture ratio can be increased as compared with a comparative example where a top gate structure TFT 110 of which the source and drain electrodes are provided in the same layer is used as a pixel TFT (FIG. 13).

Next, the configuration of the pixel TFT 10 is described more specifically.

The pixel TFT 10 includes an oxide semiconductor layer 107, a source electrode SE, a drain electrode DE and an upper gate electrode 111. The upper gate electrode 111 is provided on a part of the oxide semiconductor layer 107 with a gate insulating layer 109 interposed therebetween. The upper gate electrode 111 is covered with an interlayer insulating layer 121. On the interlayer insulating layer 121, an interlayer insulating layer 123 is provided. The source electrode SE is provided on the interlayer insulating layer 121 and is in contact with the oxide semiconductor layer 107 inside a contact hole CH3 formed in the interlayer insulating layer 121. The drain electrode DE is provided on, for example, the interlayer insulating layer 123 and is in contact with the oxide semiconductor layer 107 inside a contact hole CH4 formed in the interlayer insulating layers 121, 123. The pixel TFT 10 may further include a shield electrode 103 on the substrate 1 side of the oxide semiconductor layer 107.

The upper gate electrode 111 of the pixel TFT 10 is connected with a corresponding gate bus line GL. The source electrode SE is connected with a corresponding source bus line SL. The drain electrode DE is electrically coupled with the pixel electrode PE. In this example, the upper gate electrode 111 and the gate bus line GL are integrally formed in the gate metal layer. The source electrode SE and the source bus lines SL are integrally formed in the source metal layer. The drain electrode DE is integrally formed with the pixel electrode PE.

The interlayer insulating layer 123 includes an insulating layer 116 and a dielectric layer 117 provided on the insulating layer 116. On the insulating layer 116, the pixel electrode PE and the common electrode CE are provided so as to partially overlap each other with the dielectric layer 117 interposed therebetween. The pixel electrodes PE of respective pixels are separated from one another. The common electrodes CE of respective pixels may not be separated from one another. In this example, the common electrode CE is provided on the insulating layer 116. The common electrode CE may have an opening above a region in which the pixel TFT 10 is provided and may be provided over the entire pixel region P exclusive of this region. The pixel electrode PE is provided on the dielectric layer 117 and in the contact hole CH4 and is in contact with the oxide semiconductor layer 107 inside the contact hole CH4.

The source electrode SE of the pixel TFT 10 and the first electrode 13 of the TFT 30 (FIG. 2) that is a DMX circuit TFT may be provided in the same electrically-conductive layer (e.g., in the source metal layer). Likewise, the drain electrode DE of the pixel TFT 10 and the second electrode 15 of the TFT 30 may be provided in the same electrically-conductive layer. Alternatively, the drain electrode DE of the pixel TFT 10 may be integrally formed with the pixel electrode PE, and the second electrode 15 of the TFT 30 may be provided in the same electrically-conductive layer as the common electrode CE.

The thus-configured active matrix substrate 1000 is applicable to, for example, a FFS mode display device. The FFS mode is a transverse electric field mode in which a pair of electrodes are provided on one substrate and an electric field is applied to liquid crystal molecules in a direction parallel to the substrate surface (transverse direction). In this example, an electric field is produced which is represented by a line of electric force coming out from the pixel electrode PE and passing through the liquid crystal layer (not shown) and then through a slit-like opening of the pixel electrode PE before reaching the common electrode CE.

This electric field includes a component transverse to the liquid crystal layer. As a result, a transverse electric field can be applied across the liquid crystal layer. In the transverse electric field mode, the liquid crystal molecules do not rise from the substrate, and therefore, there is an advantage that a wider viewing angle can be realized than in the vertical electric field mode.

Although not shown, when a metal auxiliary line which has lower resistance than the common electrode CE is provided so as to be in contact with the common electrode CE, the drain electrode DE of the TFT 110 may be formed using the same metal film as the metal auxiliary line.

An electrode structure in which the pixel electrode PE is provided on the common electrode CE with the dielectric layer 117 interposed therebetween is disclosed in, for example, WO 2012/086513. Note that the common electrode CE may be provided on the pixel electrode PE with the dielectric layer 117 interposed therebetween. That is, the lower transparent electrode 115 may be the pixel electrode PE, and the upper transparent electrode 119 may be the common electrode CE. Such an electrode structure is disclosed in, for example, Japanese Laid-Open Patent Publication No. 2008-032899 and Japanese Laid-Open Patent Publication No. 2010-008758. The entire disclosures of WO 2012/086513, Japanese Laid-Open Patent Publication No. 2008-032899 and Japanese Laid-Open Patent Publication No. 2010-008758 are incorporated by reference in this specification.

<Oxide Semiconductor>

The oxide semiconductor included in the oxide semiconductor layer may be an amorphous oxide semiconductor or may be a crystalline oxide semiconductor which includes a crystalline portion. Examples of the crystalline oxide semiconductor include a polycrystalline oxide semiconductor, a microcrystalline oxide semiconductor, and a crystalline oxide semiconductor in which the c-axis is oriented generally perpendicular to the layer surface.

The oxide semiconductor layer may have a multilayer structure consisting of two or more layers. When the oxide semiconductor layer has a multilayer structure, the oxide semiconductor layer may include a non-crystalline oxide semiconductor layer and a crystalline oxide semiconductor layer. Alternatively, the oxide semiconductor layer may include a plurality of crystalline oxide semiconductor layers which have different crystalline structures. The oxide semiconductor layer may include a plurality of non-crystalline oxide semiconductor layers. When the oxide semiconductor layer has a two-layer structure which includes the upper layer and the lower layer, it is preferred that the energy gap of the oxide semiconductor included in the upper layer is greater than the energy gap of the oxide semiconductor included in the lower layer. Note that, however, when the difference in energy gap between these layers is relatively small, the energy gap of the oxide semiconductor of the lower layer may be greater than the energy gap of the oxide semiconductor of the upper layer.

The materials, structures and film formation methods of the non-crystalline oxide semiconductor and the respective aforementioned crystalline oxide semiconductors, and the configuration of the oxide semiconductor layer which has a multilayer structure, are disclosed in, for example, Japanese Laid-Open Patent Publication No. 2014-007399. The entire disclosure of Japanese Laid-Open Patent Publication No. 2014-007399 is incorporated by reference in this specification.

The oxide semiconductor layer may include, for example, at least one metal element among In, Ga and Zn. In the present embodiment, the oxide semiconductor layer includes, for example, an In—Ga—Zn—O based semiconductor (e.g., indium gallium zinc oxide). Here, the In—Ga—Zn—O based semiconductor is a ternary oxide including In (indium), Ga (gallium) and Zn (zinc). The proportion (composition ratio) of In, Ga and Zn is not particularly limited but includes, for example, In:Ga:Zn=2:2:1, In:Ga:Zn=1:1:1, and In:Ga:Zn=1:1:2. The oxide semiconductor layer which has such a composition can be formed by an oxide semiconductor film which includes an In—Ga—Zn—O based semiconductor.

The In—Ga—Zn—O based semiconductor may be amorphous or may be crystalline. As the crystalline In—Ga—Zn—O based semiconductor, a crystalline In—Ga—Zn—O based semiconductor in which the c-axis is oriented generally perpendicular to the layer surface is preferred.

The crystalline structure of the crystalline In—Ga—Zn—O based semiconductor is disclosed in, for example, aforementioned Japanese Laid-Open Patent Publication No. 2014-007399, Japanese Laid-Open Patent Publication No. 2012-134475, and Japanese Laid-Open Patent Publication No. 2014-209727. The entire disclosures of Japanese Laid-Open Patent Publication No. 2012-134475 and Japanese Laid-Open Patent Publication No. 2014-209727 are incorporated by reference in this specification. A TFT which includes an In—Ga—Zn—O based semiconductor layer has high mobility (20 times or more as compared with an a-Si TFT) and low current leakage (less than 1/100 as compared with an a-Si TFT), and is therefore suitably used as a driver TFT (e.g., a TFT included in a driving circuit provided around the display region including a plurality of pixels on the same substrate as the display region) and a pixel TFT (a TFT provided in a pixel).

The oxide semiconductor layer may contain a different oxide semiconductor instead of the In—Ga—Zn—O based semiconductor. For example, the oxide semiconductor layer may contain an In—Sn—Zn—O based semiconductor (e.g., $In_2O_3$—$SnO_2$—ZnO; InSnZnO). In—Sn—Zn—O based semiconductor is a ternary oxide including In (indium), Sn (tin) and Zn (zinc). Alternatively, the oxide semiconductor layer may contain an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, a CdO (cadmium oxide), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, or the like.

The embodiments of the present invention are suitably applicable to an active matrix substrate which includes a monolithically-formed peripheral circuit. Such an active matrix substrate is applicable to display devices such as liquid crystal display devices, organic electroluminescence (EL) display devices, and inorganic electroluminescence display devices, imaging devices such as image sensor devices, and various electronic devices such as image input devices, fingerprint readers, and semiconductor memories.

This application is based on Japanese Patent Applications No. 2017-174544 filed on Sep. 12, 2017, the entire contents of which are hereby incorporated by reference.

What is claimed is:

1. An active matrix substrate having a display region including a plurality of pixels and a non-display region provided around the display region, the active matrix substrate comprising:
    a substrate;
    a demultiplexer circuit provided in the non-display region and supported by the substrate; and
    a plurality of source bus lines extending in a first direction and a plurality of gate bus lines extending in a second direction in the display region, the second direction intersecting with the first direction,
    wherein the demultiplexer circuit includes a plurality of unit circuits, each of the unit circuits being capable of distributing a video signal from one of a plurality of video signal lines to n source bus lines out of the plurality of source bus lines, n being an integer not less than 2,
    each of the plurality of unit circuits includes at least n TFTs and n branch lines connected with the one video signal line,
    each of the at least n TFTs includes an oxide semiconductor layer, an upper gate electrode provided on the oxide semiconductor layer with a gate insulating layer interposed therebetween, and first and second electrodes electrically coupled with the oxide semiconductor layer, one of the first and second electrodes being a drain electrode electrically coupled with one of the n source bus lines, the other of the first and second electrodes being a source electrode electrically coupled with one of the n branch lines,
    the active matrix substrate further comprises a first interlayer insulating layer covering the oxide semiconductor layer and the upper gate electrode and a second interlayer insulating layer provided on the first interlayer insulating layer,
    the first electrode is provided between the first interlayer insulating layer and the second interlayer insulating layer and is in contact with the oxide semiconductor layer inside a first contact hole formed in the first interlayer insulating layer, and
    the second electrode is provided on the second interlayer insulating layer and is in contact with the oxide semiconductor layer inside a second contact hole formed in the second interlayer insulating layer and the first interlayer insulating layer.

2. The active matrix substrate of claim 1, wherein in each of the at least n TFTs, the first electrode partially overlaps the upper gate electrode with the first interlayer insulating layer interposed therebetween, and the second electrode partially overlaps the upper gate electrode with the first interlayer insulating layer and the second interlayer insulating layer interposed therebetween.

3. The active matrix substrate of claim 1, wherein a channel length direction of the at least n TFTs is the first direction, and a channel width direction of the at least n TFTs is the second direction.

4. The active matrix substrate of claim 3, wherein
    the plurality of source bus lines and the n branch lines are provided between the first interlayer insulating layer and the second interlayer insulating layer, and
    when viewed in a direction normal to the substrate, the second electrode includes a portion that overlaps the oxide semiconductor layer and an extended portion that extends from the portion in the first direction, the extended portion is coupled with the one of the n source bus lines or the one of the n branch lines inside an opening in the second interlayer insulating layer.

5. The active matrix substrate of claim 1, wherein each of the at least n TFTs further includes a lower electrode provided on the substrate side of the oxide semiconductor layer.

6. The active matrix substrate of claim 5, wherein the lower electrode is grounded.

7. The active matrix substrate of claim 5, wherein the lower electrode is electrically coupled with the upper gate electrode.

8. The active matrix substrate of claim 5, wherein the lower electrode is set to a potential different from that of the upper gate electrode.

9. The active matrix substrate of claim 1, wherein the demultiplexer circuit includes a first TFT of which the first electrode is a source electrode and the second electrode is a drain electrode and a second TFT of which the first electrode is a drain electrode and the second electrode is a source electrode.

10. The active matrix substrate of claim 1, wherein
    the demultiplexer circuit includes a plurality of sub-circuits,
    each of the sub-circuits includes at least first and second unit circuits out of the plurality of unit circuits, and
    in the each sub-circuit, the n source bus lines of the first unit circuit and the n source bus lines of the second unit circuit are arranged alternately in a one-by-one fashion in the second direction.

11. The active matrix substrate of claim 10, wherein
    in each of the first unit circuit and the second unit circuit, the at least n TFTs are arranged in the first direction, and
    in the each sub-circuit, a first unit circuit formation region in which the at least n TFTs of the first unit circuit are provided is present between a second unit circuit formation region in which the at least n TFTs of the second unit circuit are provided and the display region.

12. The active matrix substrate of claim 11, wherein the at least n TFTs of each of the first unit circuit and the second unit circuit include a first TFT of which the first electrode is a source electrode and the second electrode is a drain electrode and a second TFT of which the first electrode is a drain electrode and the second electrode is a source electrode.

13. The active matrix substrate of claim 1, wherein a width in a channel length direction of each of the at least n TFTs is smaller than an arrangement pitch of the plurality of source bus lines.

14. The active matrix substrate of claim 1, further comprising a pixel TFT provided in each of the plurality of pixels, wherein
    the pixel TFT includes another oxide semiconductor layer, another source electrode, another drain electrode, and another upper gate electrode provided on a side of the another oxide semiconductor layer opposite to the substrate with an insulating film interposed therebetween, and
    the another source electrode is provided in a same electrically-conductive layer as the plurality of source bus lines, and the another drain electrode is provided in another electrically-conductive layer lying above the electrically-conductive layer.

15. The active matrix substrate of claim 1, wherein the oxide semiconductor layer includes an In—Ga—Zn—O based semiconductor.

16. The active matrix substrate of claim 15, wherein the In—Ga—Zn—O based semiconductor includes a crystalline portion.

17. A demultiplexer circuit, comprising a plurality of unit circuits, each of the unit circuits being capable of distributing a video signal from one of a plurality of video signal lines to n source bus lines out of a plurality of source bus lines, n being an integer not less than 2, wherein each of the plurality of unit circuits includes at least n TFTs and n branch lines connected with the one video signal line, each of the at least n TFTs includes an oxide semiconductor layer, an upper gate electrode provided on the oxide semiconductor layer with a gate insulating layer interposed therebetween, and first and second electrodes electrically coupled with the oxide semiconductor layer, one of the first and second electrodes being a drain electrode electrically coupled with one of the n source bus lines, the other of the first and second electrodes being a source electrode electrically coupled with one of the n branch lines, the demultiplexer circuit further comprises a first interlayer insulating layer covering the oxide semiconductor layer and the upper gate electrode and a second interlayer insulating layer provided on the first interlayer insulating layer, the first electrode is provided between the first interlayer insulating layer and the second interlayer insulating layer and is in contact with the oxide semiconductor layer inside a first contact hole formed in the first interlayer insulating layer, and the second electrode is provided on the second interlayer insulating layer and is in contact with the oxide semiconductor layer inside a second contact hole formed in the second interlayer insulating layer and the first interlayer insulating layer.

* * * * *